United States Patent
Cho et al.

(10) Patent No.: US 8,368,068 B2
(45) Date of Patent: Feb. 5, 2013

(54) DISPLAY WITH PHOTO SENSOR AND MANUFACTURING METHOD THEREOF

(75) Inventors: An-Thung Cho, Hualien County (TW); Wei-Ting Lin, New Taipei (TW); Jiun-Jye Chang, Hsinchu (TW); Tien-Hao Chang, Taoyuan County (TW); Po-Lun Chen, Hsinchu County (TW); Wei-Lung Liao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/177,569

(22) Filed: Jul. 7, 2011

(65) Prior Publication Data

US 2012/0205646 A1 Aug. 16, 2012

(30) Foreign Application Priority Data

Feb. 11, 2011 (TW) .................................. 100104578

(51) Int. Cl.
*H01L 33/08* (2010.01)

(52) U.S. Cl. ........................................... 257/43; 438/34
(58) Field of Classification Search .................... 257/43, 257/53, E33.02; 438/34
See application file for complete search history.

(56) References Cited

U.S. PATENT DOCUMENTS

| | | | |
|---|---|---|---|
| 7,682,883 B2 * | 3/2010 | Cho et al. | 438/149 |
| 2009/0280606 A1 * | 11/2009 | Shih et al. | 438/155 |
| 2010/0327289 A1 * | 12/2010 | Cho et al. | 257/72 |

* cited by examiner

*Primary Examiner* — Thao P. Le
(74) *Attorney, Agent, or Firm* — Jianq Chyun IP Office

(57) ABSTRACT

A display with a photo sensor is provided, wherein the photo sensor is integrated with an active device array substrate of the display and fabricated through an existing process to reduce the manufacturing cost. A photosensitive silicon-rich dielectric layer or any other photosensitive material layer having similar photosensitive characteristics (for example, a photosensitive semiconductor layer) is adopted to form the photo sensor with a lower electrode and a transparent upper electrode. Thereby, the fill factor of the photo sensor is maximized and noises caused by a backlight source electrode are eliminated.

25 Claims, 23 Drawing Sheets

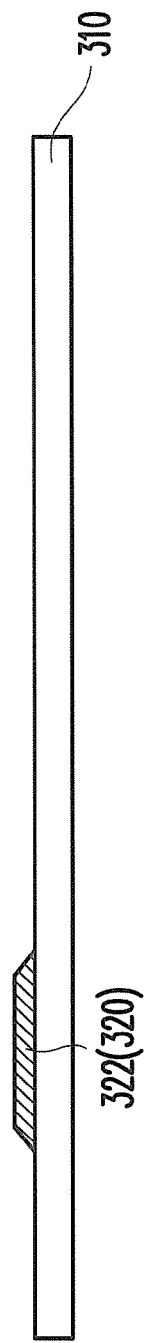
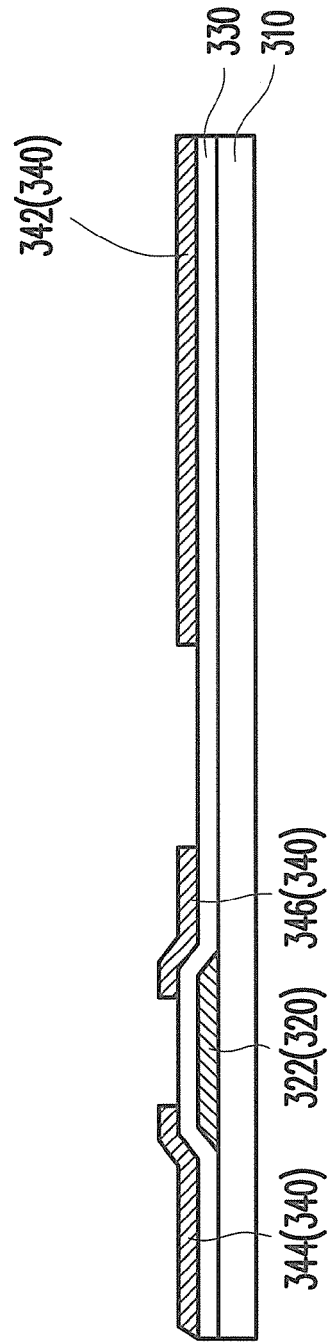

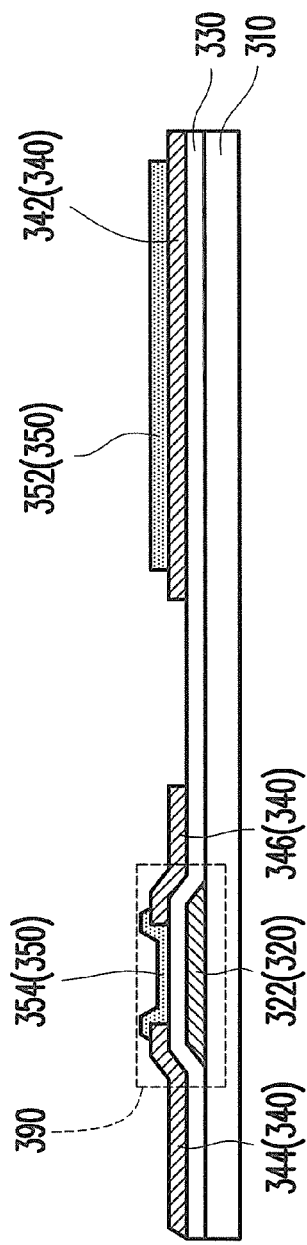
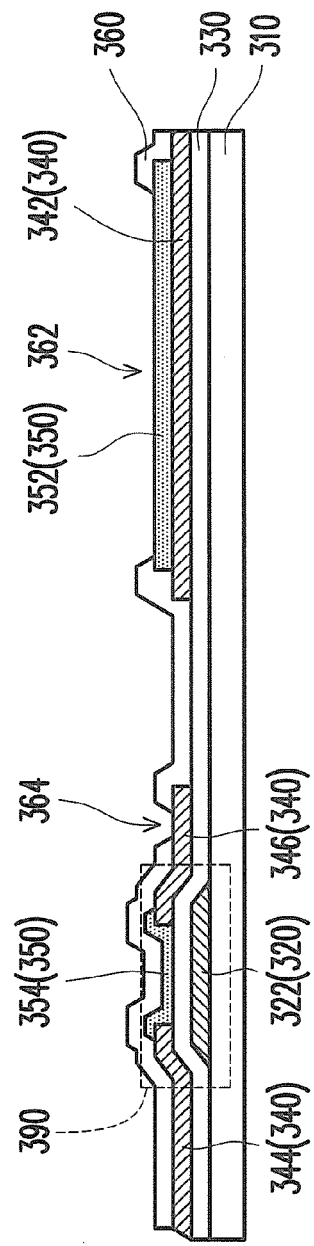

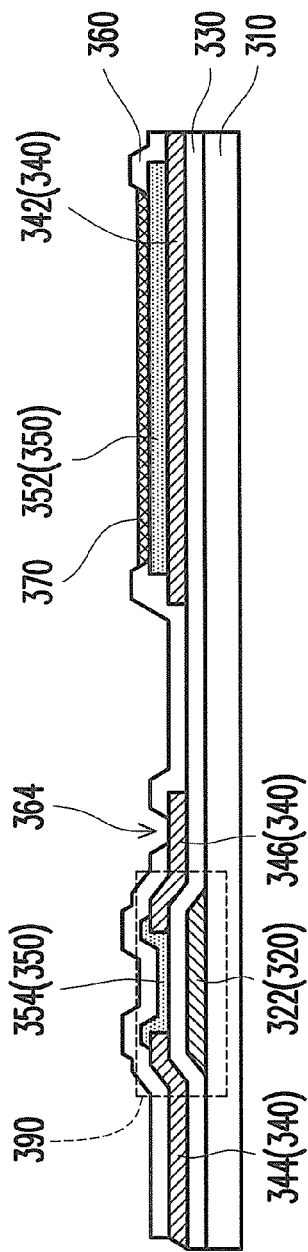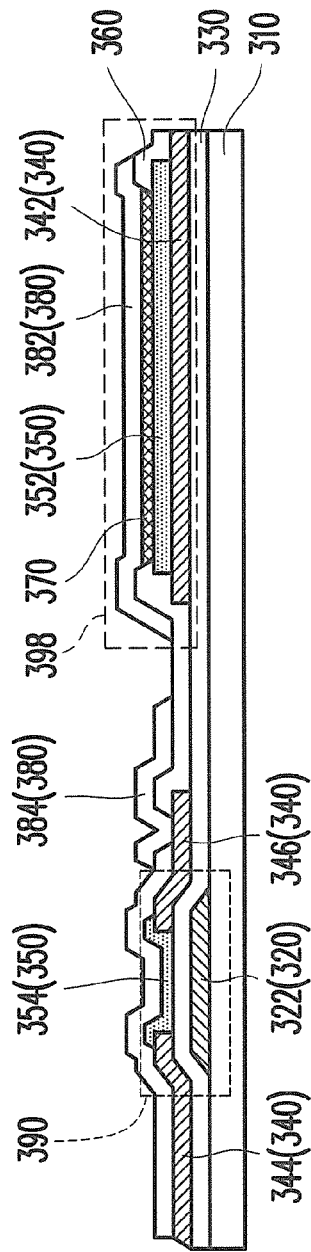

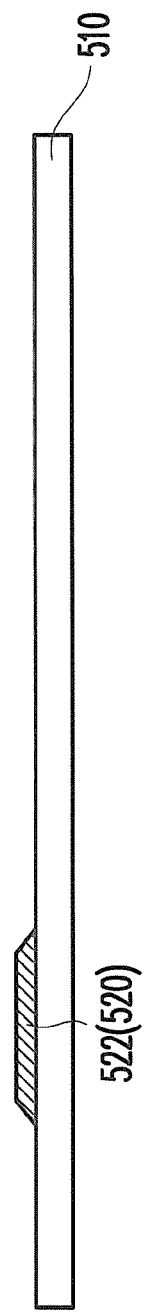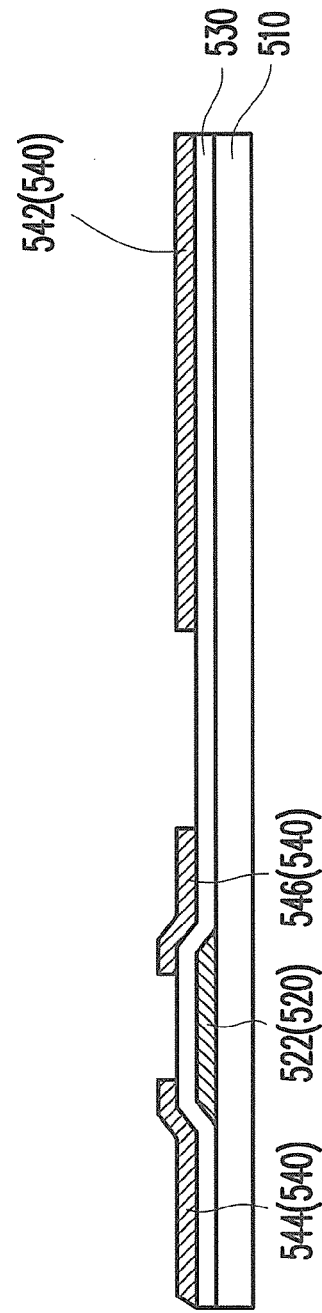
FIG. 5A
FIG. 5B

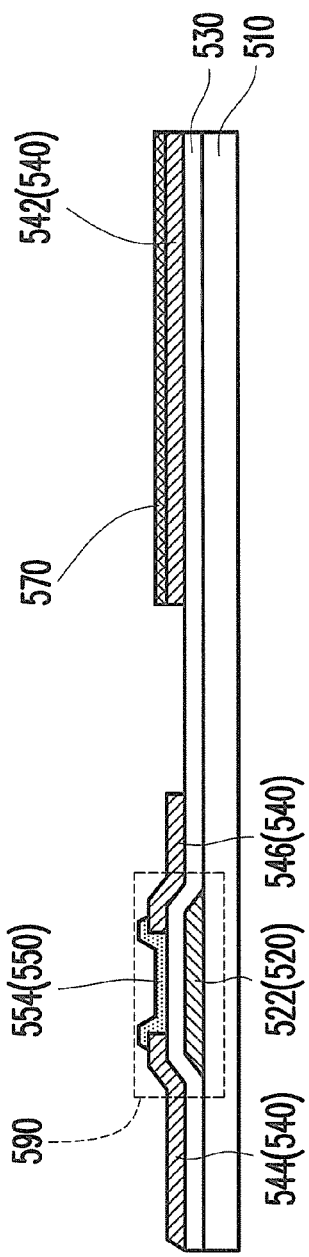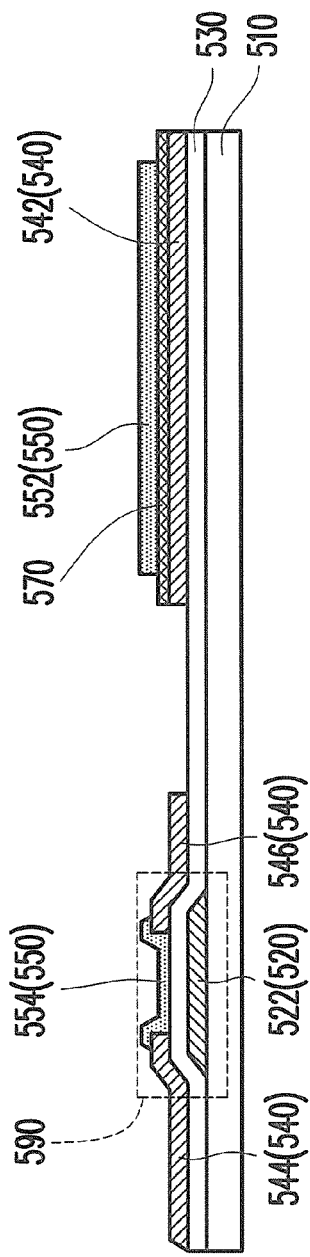

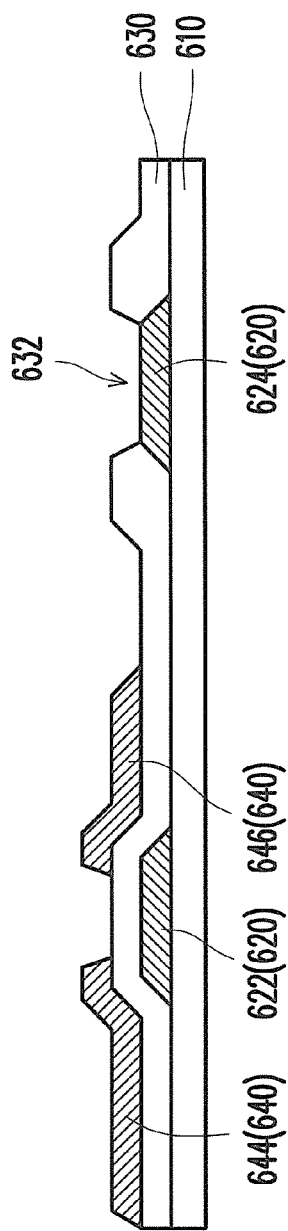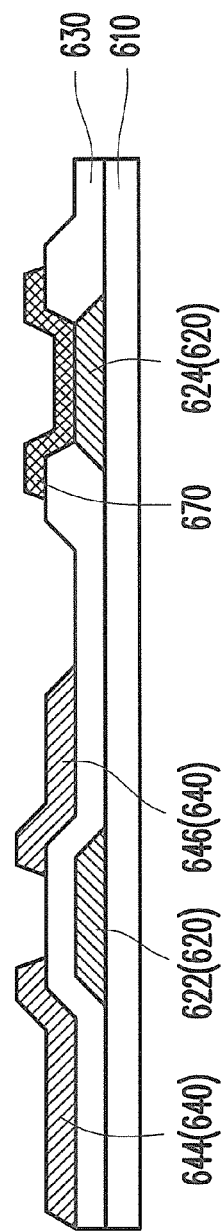
FIG. 6C
FIG. 6D

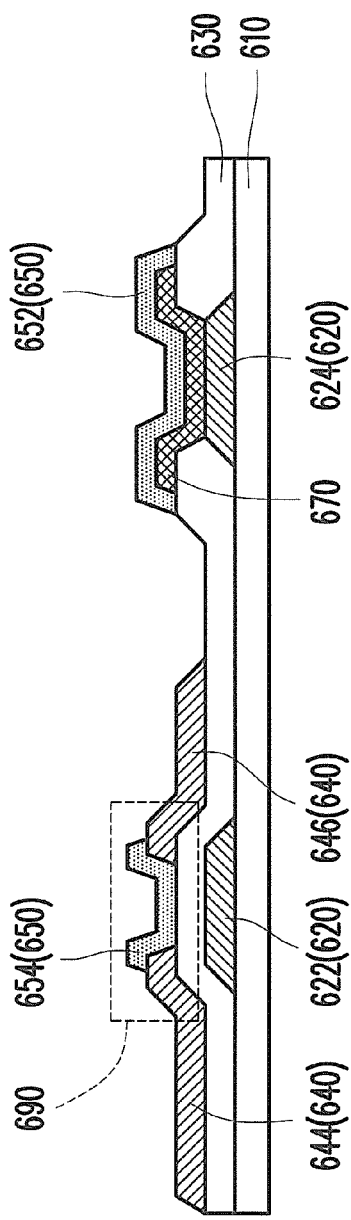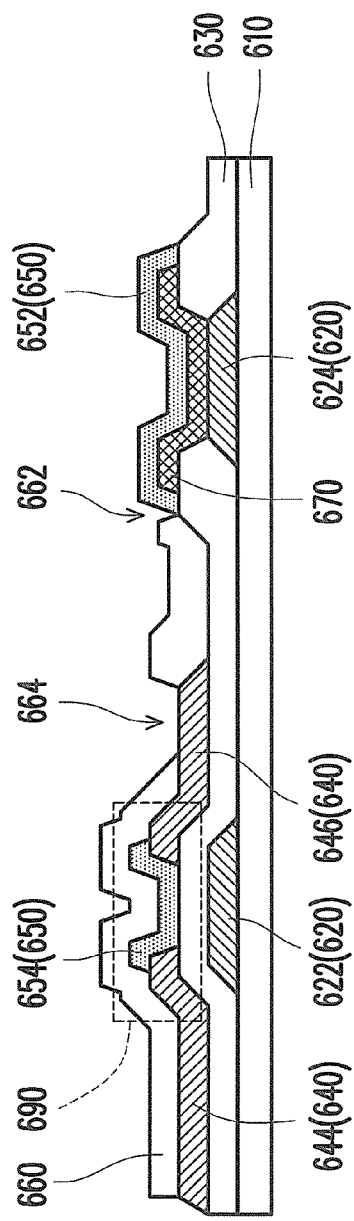

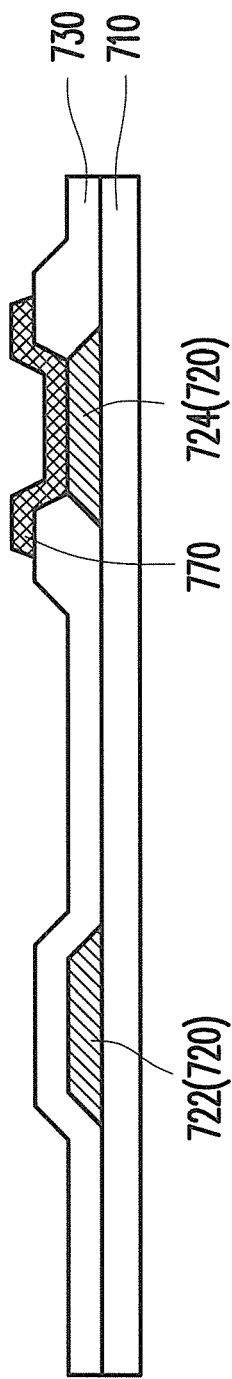
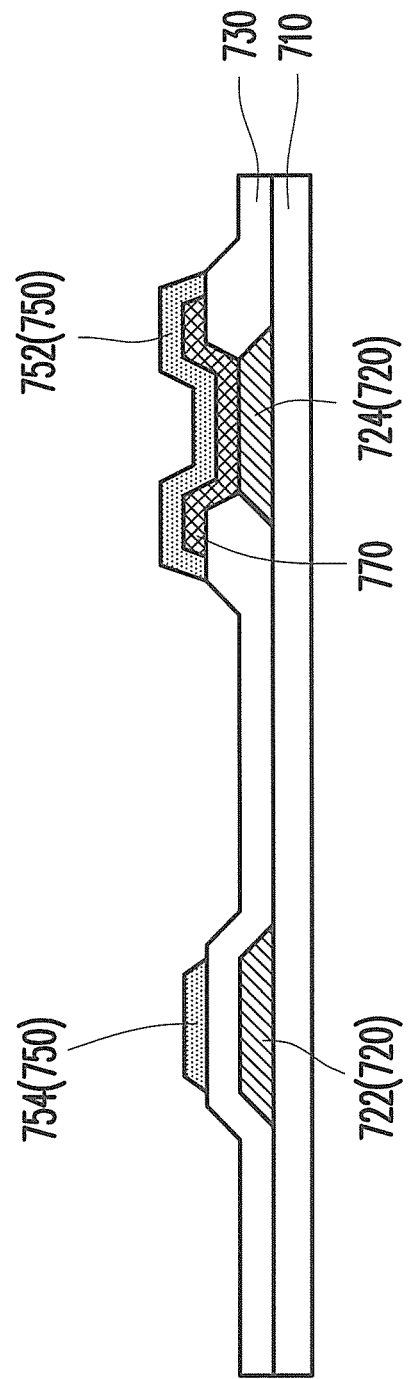
FIG. 7C
FIG. 7D

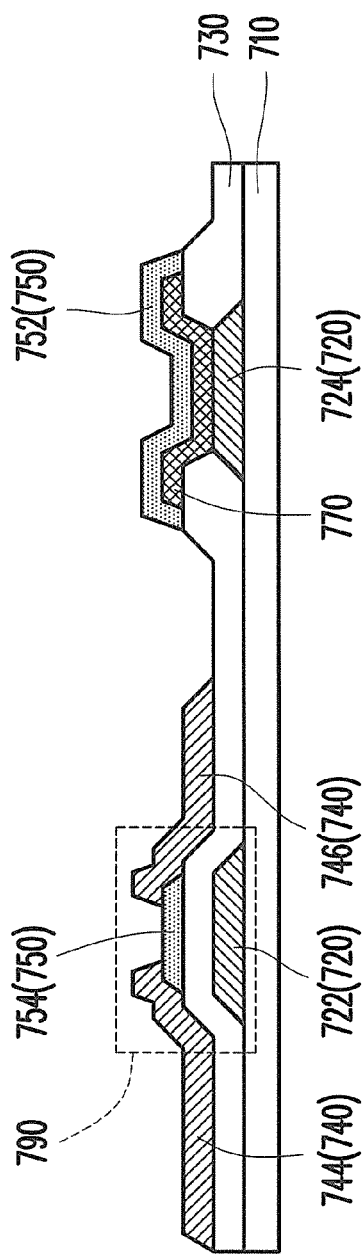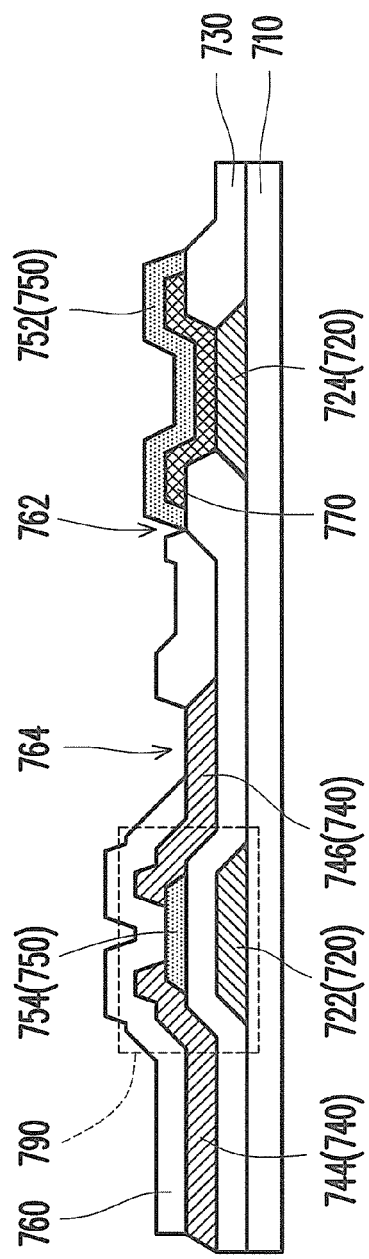

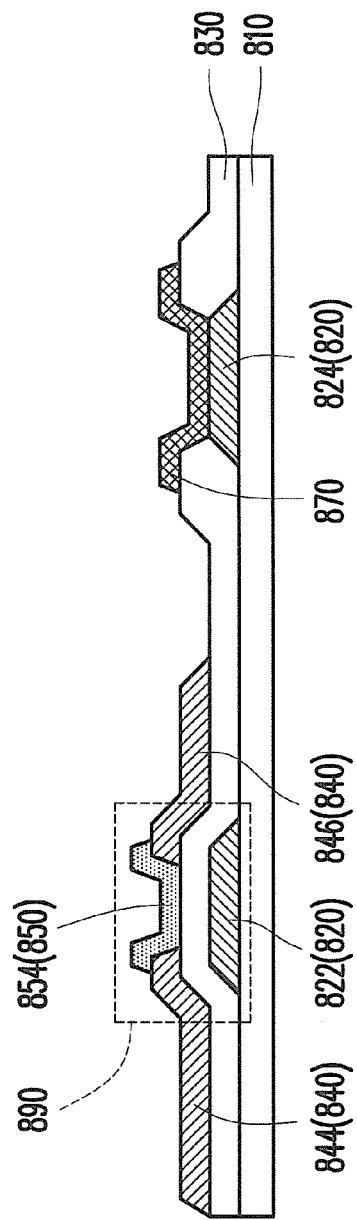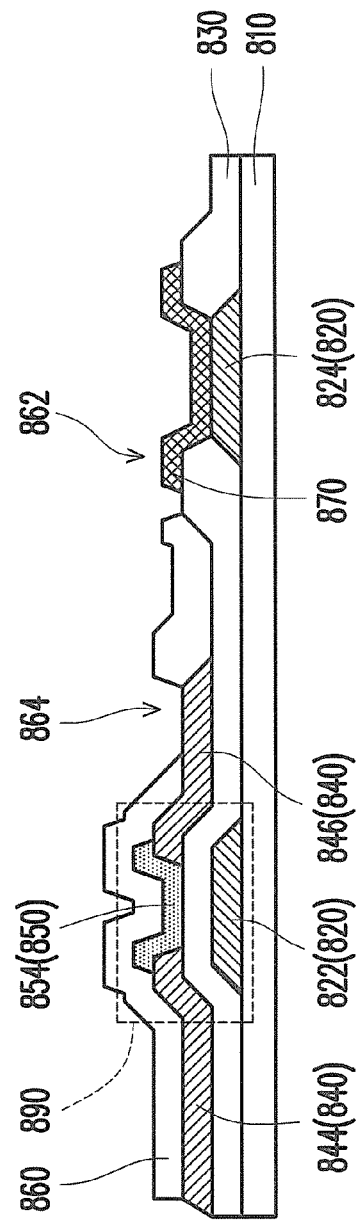

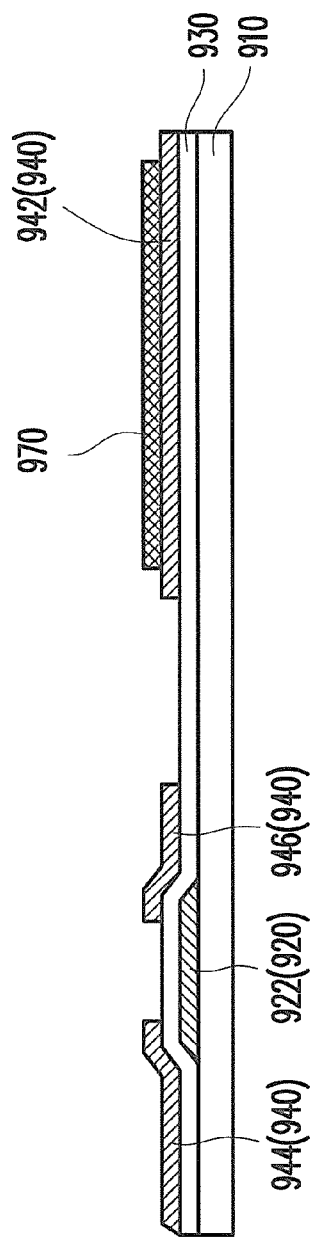
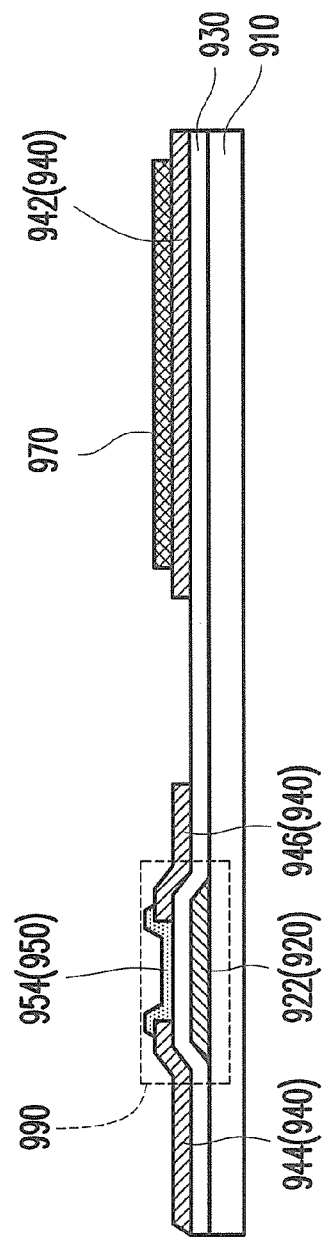
FIG. 9C
FIG. 9D

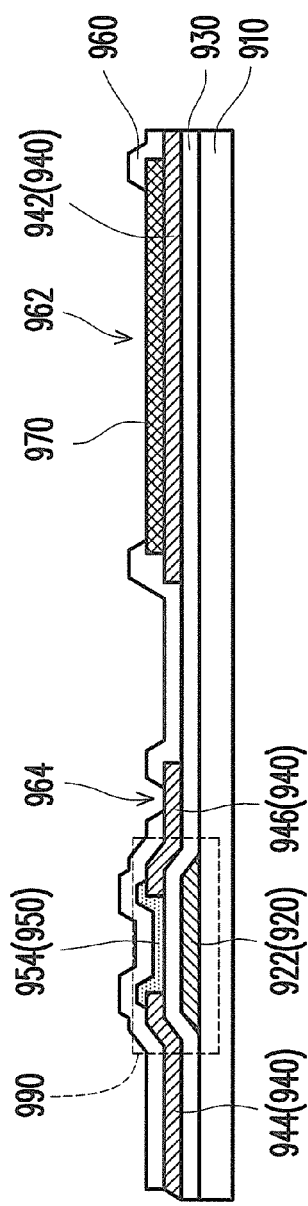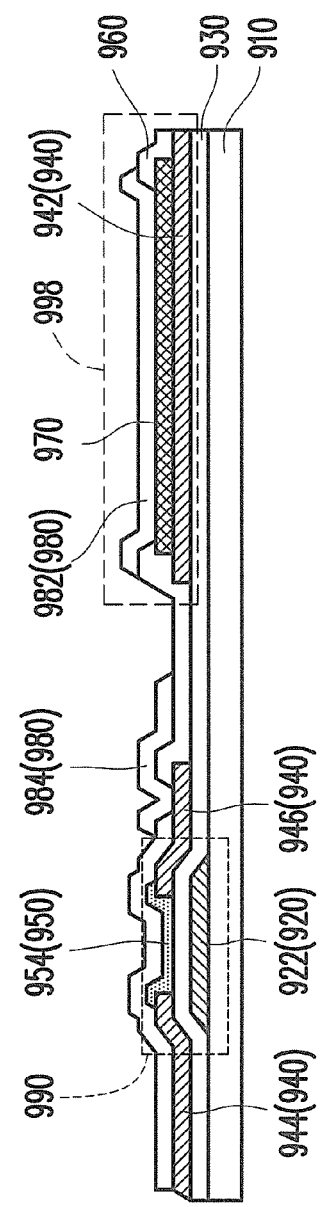

DISPLAY WITH PHOTO SENSOR AND MANUFACTURING METHOD THEREOF

CROSS-REFERENCE TO RELATED APPLICATION

This application claims the priority benefit of Taiwan application serial no. 100104578, filed on Feb. 11, 2011. The entirety of the above-mentioned patent application is hereby incorporated by reference herein and made a part of this specification.

BACKGROUND OF THE INVENTION

1. Field of the Invention

The invention generally relates to a display and a manufacturing method thereof, and more particularly, to a display with a photo sensor and a manufacturing method thereof.

2. Description of Related Art

Along with the widespread of liquid crystal display (LCD) and plasma display, flat panel display has become so-called "multimedia board" besides being used for viewing images. Touch panel integration on glass is a new display technique, in which a photo sensor is fabricated on the active device array substrate and the touch-input function of the touch panel is integrated into the display panel so that the display panel can perform the touch-input function of the touch panel.

On the other hand, along with the advancement of the display panel technology, photo and image sensing techniques have been gradually applied to display panel products. Because the low temperature Poly-Si (LTPS) technique offers optimal device characteristics in thin film transistors, the possibility of transplanting image sensing circuit to LTPS display panel is greatly increased. However, because the Poly-Si film used in the LTPS process has insufficient thickness (<50 nm), the electro-optical characteristics of the P-I-N photodiode are not satisfactory and are easily affected by the intensive backlight of the display panel.

SUMMARY OF THE INVENTION

Accordingly, the invention is directed to a display, wherein the fabrication of a photo sensor is integrated into the manufacturing process of the display so that the photo sensor can be applied for in-cell touch-input or other image sensing functions.

The invention is directed to a display with a photo sensor, wherein the photo sensor is directly fabricated along with an active device (for example, a LTPS-TFT or an a-Si TFT) and offers optimal electro-optical characteristics, large fill factor, and the capability of backlight shielding.

The invention is directed to a display with a photo sensor, wherein the photo sensor has a photosensitive silicon-rich dielectric layer therefore offers optimal electro-optical characteristics, the capability of modulating absorption spectrum, and high process integration capability.

The invention provides a display including a substrate, an active device, a pixel electrode, and a photo sensor. The active device is disposed on the substrate and has a channel layer. The pixel electrode is disposed on the substrate and electrically connected to the active device. The photo sensor is disposed on the substrate and includes a lower electrode, a stacked photosensitive layer, and a transparent upper electrode. The lower electrode is disposed on the substrate. The stacked photosensitive layer is disposed on the lower electrode and includes a photosensitive silicon-rich dielectric layer and a guide layer that are stacked together, wherein the channel layer and the guide layer are the same layer and are formed by an oxide semiconductor. In addition, the transparent upper electrode is disposed on the stacked photosensitive layer.

According to an embodiment of the invention, the oxide semiconductor may include IGZO.

According to an embodiment of the invention, the guide layer is between the photosensitive silicon-rich dielectric layer and the lower electrode.

According to an embodiment of the invention, the guide layer is between the photosensitive silicon-rich dielectric layer and the transparent upper electrode.

According to an embodiment of the invention, the pixel electrode and the transparent upper electrode are formed by the same layer.

According to an embodiment of the invention, the active device includes a gate electrode, a gate dielectric layer, a source electrode and a drain electrode, and the channel layer. The gate electrode and the gate dielectric layer are disposed on the substrate, and the gate dielectric layer covers the gate electrode. The source electrode and the drain electrode are disposed on the gate dielectric layer and at both sides of the gate electrode. The channel layer is disposed on the gate dielectric layer and above the gate electrode, and the channel layer is between the source electrode and the drain electrode.

According to an embodiment of the invention, the lower electrode and the gate electrode are formed by the same layer.

According to an embodiment of the invention, the lower electrode and the source electrode and the drain electrode are formed by the same layer.

According to an embodiment of the invention, the display further includes a passivation layer that covers the gate dielectric layer, the source electrode and the drain electrode, and the oxide semiconductor layer. The passivation layer has a contact window. The pixel electrode is electrically connected to the drain electrode through the contact window. In addition, the passivation layer further has an opening, and the transparent upper electrode is electrically connected to the stacked photosensitive layer through the opening.

According to an embodiment of the invention, the channel layer is between the source electrode and the drain electrode and above a part of the source electrode and the drain electrode.

According to an embodiment of the invention, the channel layer is between the source electrode and the drain electrode and below a part of the source electrode and the drain electrode.

According to an embodiment of the invention, the display has a display area and a peripheral circuit area surrounding the display area. The active device is within the display area, and the photo sensor is within the peripheral circuit area.

According to an embodiment of the invention, the display has a plurality of pixel areas arranged into an array, and the active device and the photo sensor are within the same pixel area.

According to an embodiment of the invention, the display further includes a display medium layer and an opposite electrode. The display medium layer is disposed on the pixel electrode, and the opposite electrode is disposed on the display medium layer.

According to an embodiment of the invention, the display medium layer includes a liquid crystal layer, an organic light emitting layer, or an electrophoresis material layer.

The invention provides a display including a substrate, an active device, a pixel electrode, and a photo sensor. The active device is disposed on the substrate and has a channel layer. The pixel electrode is disposed on the substrate and electrically connected to the active device. The photo sensor is disposed on the substrate and includes a lower electrode, a stacked photosensitive layer, and a transparent upper electrode. The lower electrode is disposed on the substrate. The stacked photosensitive layer is disposed on the lower electrode. The stacked photosensitive layer includes a photosensitive material layer and a guide layer that are stacked together, wherein the channel layer and the guide layer are the same layer and are formed by an oxide semiconductor. The transparent upper electrode is disposed on the stacked photosensitive layer.

According to an embodiment of the invention, the photosensitive material layer includes a photosensitive silicon-rich dielectric layer or a photosensitive semiconductor layer.

The invention provides a display manufacturing method including following steps. A substrate is provided. An active device is fabricated on the substrate, wherein the active device has a channel layer. A lower electrode is formed on the substrate. A stacked photosensitive layer is formed on the lower electrode, wherein the stacked photosensitive layer includes a photosensitive silicon-rich dielectric layer and a guide layer that are stacked together, and the channel layer and the guide layer are the same layer are formed by an oxide semiconductor. A transparent upper electrode is formed on the stacked photosensitive layer. A pixel electrode is formed on the substrate, wherein the pixel electrode is electrically connected to the active device.

According to an embodiment of the invention, the display manufacturing method includes following steps. A first patterned metal layer is formed on the substrate to form a gate electrode of the active device. A gate dielectric layer is formed on the substrate to cover the first patterned metal layer. A second patterned metal layer is formed on the gate dielectric layer to form the lower electrode and a source electrode and a drain electrode of the active device. An oxide semiconductor layer is formed on the second patterned metal layer to form the channel layer of the active device and the guide layer, wherein the channel layer is between the source electrode and the drain electrode and above the gate electrode. A passivation layer is formed on the gate dielectric layer to cover the second patterned metal layer and the oxide semiconductor layer, wherein the passivation layer has a contact window and an opening, the contact window exposes at least a part of the drain electrode, and the opening exposes at least a part of the guide layer. The photosensitive silicon-rich dielectric layer is formed within the opening and to cover the guide layer. A transparent conductive layer is formed on the passivation layer to form the pixel electrode and the transparent upper electrode, wherein the pixel electrode is connected to the drain electrode of the active device through the contact window, and the transparent upper electrode is connected to the photosensitive silicon-rich dielectric layer through the opening.

According to an embodiment of the invention, the display manufacturing method includes following steps. A first patterned metal layer is formed on the substrate to form a gate electrode of the active device. A gate dielectric layer is formed on the substrate to cover the first patterned metal layer. A second patterned metal layer is formed on the gate dielectric layer to form the lower electrode and a source electrode and a drain electrode of the active device. The photosensitive silicon-rich dielectric layer is formed on the lower electrode. An oxide semiconductor layer is formed on the second patterned metal layer to form the channel layer of the active device and the guide layer, wherein the channel layer is between the source electrode and the drain electrode and above the gate electrode, and the guide layer is on the photosensitive silicon-rich dielectric layer. A passivation layer is formed on the gate dielectric layer to cover the second patterned metal layer and the oxide semiconductor layer, wherein the passivation layer has a contact window and an opening, the contact window exposes at least a part of the drain electrode, and the opening exposes at least a part of the guide layer. A transparent conductive layer is formed on the passivation layer to form the pixel electrode and the transparent upper electrode, wherein the pixel electrode is connected to the drain electrode of the active device through the contact window, and the transparent upper electrode is connected to the photosensitive silicon-rich dielectric layer through the opening.

According to an embodiment of the invention, the display manufacturing method includes following steps. A first patterned metal layer is formed on the substrate to form the lower electrode and a gate electrode of the active device. A gate dielectric layer is formed on the substrate to cover the first patterned metal layer, wherein the gate dielectric layer has a first opening, and the first opening exposes at least a part of the lower electrode. The photosensitive silicon-rich dielectric layer is formed within the first opening and to cover the lower electrode. A second patterned metal layer is formed on the gate dielectric layer to form a source electrode and a drain electrode of the active device. An oxide semiconductor layer is formed on the second patterned metal layer to form the channel layer of the active device and the guide layer, wherein the channel layer is between the source electrode and the drain electrode and above the gate electrode, and the guide layer is disposed on the photosensitive silicon-rich dielectric layer. A passivation layer is formed on the gate dielectric layer to cover the second patterned metal layer and the oxide semiconductor layer, wherein the passivation layer has a contact window and a second opening, the contact window exposes at least a part of the drain electrode, and the second opening exposes at least a part of the guide layer. A transparent conductive layer is formed on the passivation layer to form the pixel electrode and the transparent upper electrode, wherein the pixel electrode is connected to the drain electrode of the active device through the contact window, and the transparent upper electrode is connected to the guide layer through the second opening.

According to an embodiment of the invention, the display manufacturing method includes following steps. A first patterned metal layer is formed on the substrate to form a gate electrode of the active device and the lower electrode. A gate dielectric layer is formed on the substrate to cover the first patterned metal layer, wherein the gate dielectric layer has a first opening, and the first opening exposes at least a part of the lower electrode. The photosensitive silicon-rich dielectric layer is formed within the first opening and to cover the lower electrode. An oxide semiconductor layer is formed on the gate dielectric layer to form the channel layer of the active device and the guide layer, wherein the channel layer is above the gate electrode, and the guide layer is disposed on the photosensitive silicon-rich dielectric layer. A second patterned metal layer is formed on the gate dielectric layer to form a source electrode and a drain electrode of the active device, wherein the source electrode and the drain electrode cover two opposite sides of the channel layer. A passivation layer is formed on the gate dielectric layer to cover the second patterned metal layer and the oxide semiconductor layer, wherein the passivation layer has a contact window and a second opening, the contact window exposes at least a part of the drain electrode, and the second opening exposes at least a part of the guide layer. A transparent conductive layer is formed on the passivation layer to form the pixel electrode and the transparent upper electrode, wherein the pixel electrode is connected to the drain electrode of the active device through the contact window, and the transparent upper electrode is connected to the guide layer through the second opening.

The invention provides a display manufacturing method including following steps. A substrate is provided. An active device is fabricated on the substrate, wherein the active device has a channel layer formed by an oxide semiconductor. A lower electrode is formed on the substrate. A photosensitive silicon-rich dielectric layer is formed on the lower electrode. A transparent upper electrode is formed on the stacked photosensitive layer. A pixel electrode is formed on the substrate, wherein the pixel electrode is electrically connected to the active device.

According to an embodiment of the invention, the display manufacturing method includes following steps. A first patterned metal layer is formed on the substrate to form the lower electrode and a gate electrode of the active device. A gate dielectric layer is formed on the substrate to cover the first patterned metal layer, wherein the gate dielectric layer has a first opening, and the first opening exposes at least a part of the lower electrode. The photosensitive silicon-rich dielectric layer is formed within the first opening and to cover the lower electrode. A second patterned metal layer is formed on the gate dielectric layer to form a source electrode and a drain electrode of the active device. An oxide semiconductor layer is fanned on the second patterned metal layer to form a channel layer of the active device, wherein the channel layer is between the source electrode and the drain electrode and above the gate electrode. A passivation layer is formed on the gate dielectric layer to cover the second patterned metal layer, the oxide semiconductor layer, and the photosensitive silicon-rich dielectric layer, wherein the passivation layer has a contact window and a second opening, the contact window exposes at least a part of the drain electrode, and the second opening exposes at least a part of the photosensitive silicon-rich dielectric layer. A transparent conductive layer is formed on the passivation layer to form the pixel electrode and the transparent upper electrode, wherein the pixel electrode is connected to the drain electrode of the active device through the contact window, and the transparent upper electrode is connected to the photosensitive silicon-rich dielectric layer through the second opening.

According to an embodiment of the invention, the display manufacturing method includes following steps. A first patterned metal layer is formed on the substrate to form a gate electrode of the active device. A gate dielectric layer is formed on the substrate to cover the first patterned metal layer. A second patterned metal layer is formed on the gate dielectric layer to form the lower electrode and a source electrode and a drain electrode of the active device. An oxide semiconductor layer is foamed on the second patterned metal layer to form a channel layer of the active device, wherein the channel layer is between the source electrode and the drain electrode and above the gate electrode. A passivation layer is formed on the gate dielectric layer to cover the second patterned metal layer and the oxide semiconductor layer, wherein the passivation layer has a contact window and an opening, the contact window exposes at least a part of the drain electrode, and the opening exposes at least a part of the lower electrode. The photosensitive silicon-rich dielectric layer is formed within the opening and to cover the lower electrode. A transparent conductive layer is formed on the passivation layer to form the pixel electrode and the transparent upper electrode, wherein the pixel electrode is connected to the drain electrode of the active device through the contact window, and the transparent upper electrode is connected to the photosensitive silicon-rich dielectric layer through the opening.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3A-3F illustrate a display manufacturing method according to an embodiment of the invention.

FIGS. 5A-5F illustrate a display manufacturing method according to another embodiment of the invention.

FIGS. 6A-6G illustrate a display manufacturing method according to another embodiment of the invention.

FIGS. 7A-7G illustrate a display manufacturing method according to another embodiment of the invention.

FIGS. 8A-8G illustrate a display manufacturing method according to another embodiment of the invention.

FIGS. 9A-9F illustrate a display manufacturing method according to another embodiment of the invention.

DESCRIPTION OF THE EMBODIMENTS

Figure 2:
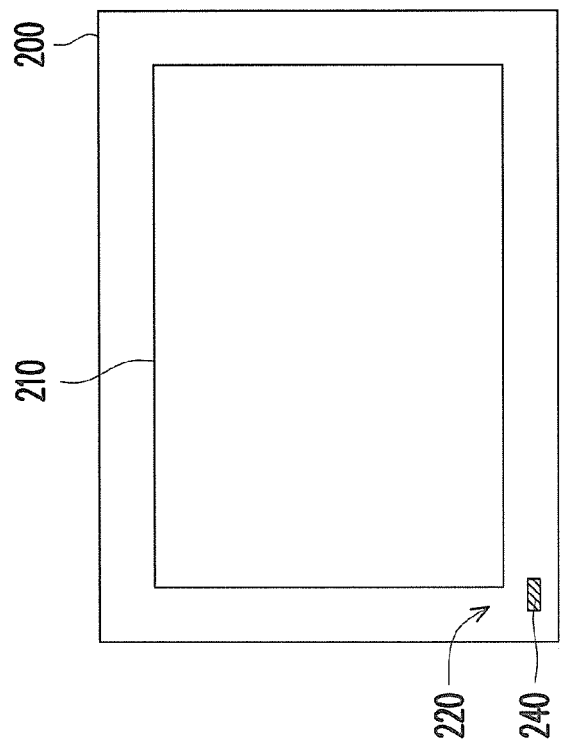
FIG. 2 illustrates a display with an ambient light sensor according to another embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In a display provided by the invention, a photo sensor is adopted for multiple purposes. For example, the photo sensor may be used for in-cell touch-input or as an ambient light sensor of the display.

Figure 1:
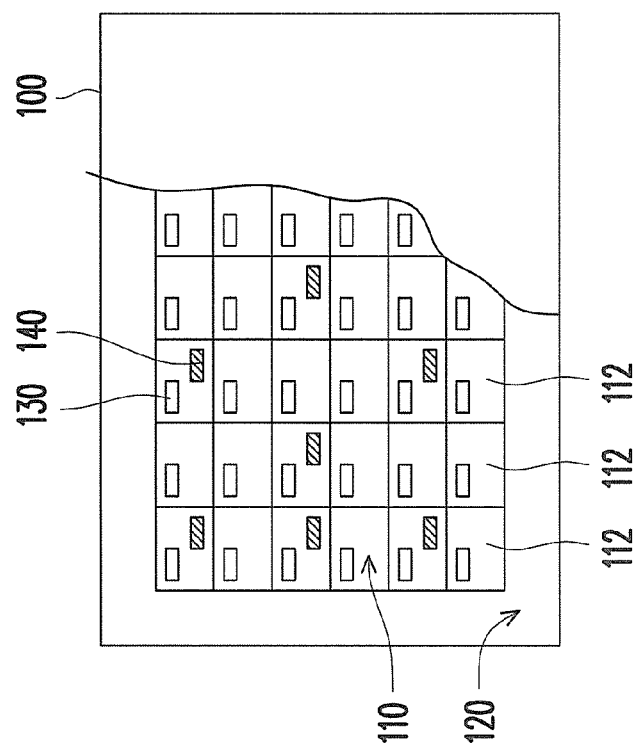
FIG. 1 illustrates an in-cell touch panel display with a photo sensor according to an embodiment of the invention.

FIG. 1 illustrates an in-cell touch panel display with a photo sensor according to an embodiment of the invention. As shown in FIG. 1, the display 100 includes a display area 110 and a peripheral circuit area 120. A plurality of pixel areas 112 is arranged into an array within the display area 110 and configured to display frames. Both an active device (for example, a thin film transistor) 130 and a photo sensor 140 are disposed within a specific pixel area 112. The photo sensor 140 senses the backlight reflected by a user's finger and accordingly determines the position on the display panel that is touched by the user so as to carry out different touch operation.

FIG. 2 illustrates a display with an ambient light sensor according to another embodiment of the invention. As shown in FIG. 2, the display 200 includes a display area 210 and a peripheral circuit area 220. In the present embodiment, a photo sensor 240 is disposed within the peripheral circuit area 220 (which surrounds the display area 210 of the display 200). When the display 200 is in operation, the photo sensor 240 receives ambient light and outputs a corresponding control signal such that different operation can be performed on the display 200. For example, the brightness of the backlight is adjusted to reduce power consumption. Or, the brightness and contrast of the display are automatically adjusted according to the intensity of the ambient light so that the user's eyes can be protected from high brightness and reflection and the power consumption of the display 200 can be reduced.

Regardless of which one of aforementioned structures is adopted, in the invention, the fabrication of the photo sensor can always be integrated with the fabrication of the active device in the display. Below, embodiments of the invention will be described in order to explain how a photo sensor is integrated into and fabricated along with a display.

FIGS. 3A-3F illustrate a display manufacturing method according to an embodiment of the invention. First, referring to FIG. 3A, a first patterned metal layer 320 is formed on a substrate 310 to form a gate electrode 322. Then, referring to FIG. 3B, a gate dielectric layer 330 is formed on the substrate 310 to cover the gate electrode 322. Besides, a second patterned metal layer 340 is formed on the gate dielectric layer 330 to form a lower electrode 342 and a source electrode 344 and a drain electrode 346 at the same layer.

Next, as shown in FIG. 3C, an oxide semiconductor layer 350 is foamed on the second patterned metal layer 340 to form a channel layer 354 and a guide layer 352 at the same layer, wherein the channel layer 354 is between the source electrode 344 and the drain electrode 346 and above the gate electrode 322. The oxide semiconductor layer 350 may be made of indium gallium zinc oxide (IGZO), indium gallium oxide (IGO), indium zinc oxide (IZO), or zinc tin oxide (ZTO), etc. However, the material of the oxide semiconductor layer 350 is not limited in the invention. In addition, the gate electrode 322, the gate dielectric layer 330, the source electrode 344 and the drain electrode 346, and the channel layer 354 form a thin film transistor 390, and the thin film transistor 390 is served as an active device.

Thereafter, as shown in FIG. 3D, a passivation layer 360 is formed on the gate dielectric layer 330 to cover the second patterned metal layer 340 and the oxide semiconductor layer 350. The passivation layer 360 has a contact window 364 and an opening 362. The contact window 364 exposes at least a part of the drain electrode 346, and the opening 362 exposes at least a part of the guide layer 352.

Next, referring to FIG. 3E, a photosensitive silicon-rich dielectric layer 370 is formed within the opening 362 and to cover the guide layer 352. Besides, as shown in FIG. 3F, a transparent conductive layer 380 is formed on the passivation layer 360 to form a pixel electrode 384 and a transparent upper electrode 382 at the same layer. The pixel electrode 384 is connected to the drain electrode 346 through the contact window 364, and the transparent upper electrode 382 is connected to the photosensitive silicon-rich dielectric layer 370 through the opening 362.

Figure 4:
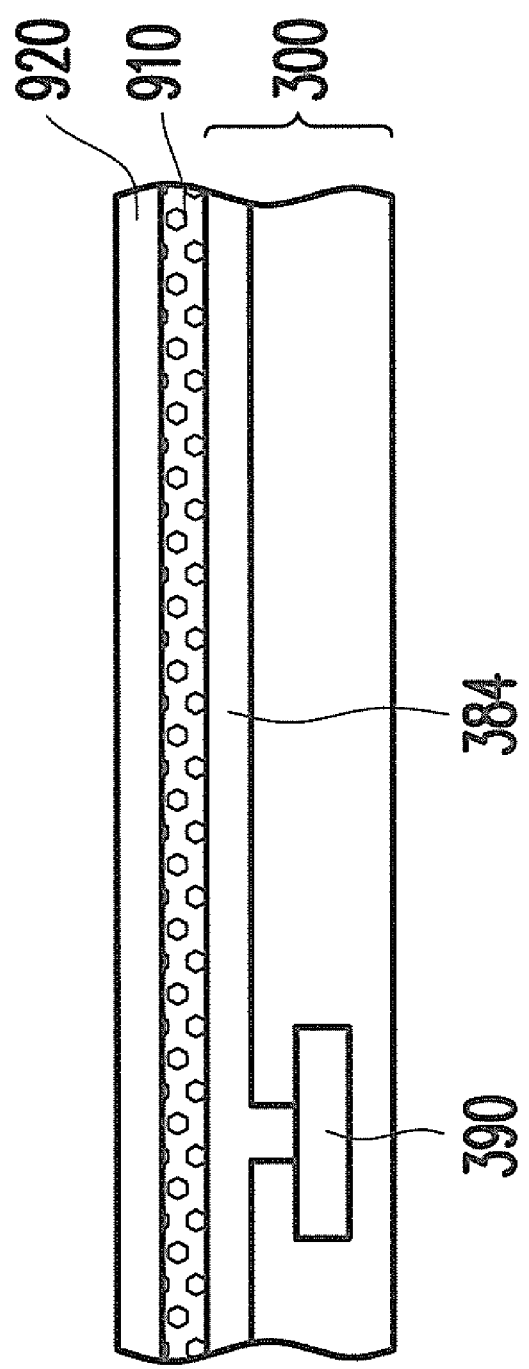
FIG. 4 illustrates the complete structure of a display according to an embodiment of the invention.

By now, the fabrication of an active device array substrate in the display is approximately completed. Substantially, as shown in FIG. 4, in the present embodiment, a display medium layer 910 and an opposite electrode 920 are further disposed on the active device array substrate 300 to complete a display 400. In the display 400 of the present embodiment, the display medium layer 910 is disposed on the pixel electrode 384, and the opposite electrode 920 is disposed on the display medium layer 910. Depending on the type of the display 400, the display medium layer 910 may be a liquid crystal layer, an organic light emitting layer, an electrophoresis material layer or any other suitable display medium. The detailed structure and fabrication technique of the display medium layer 910 are well known to those skilled in the art therefore will not be described herein.

In the present embodiment, the photosensitive silicon-rich dielectric layer 370 and the guide layer 352 are stacked together to form a stacked photosensitive layer. Silicon atoms in the photosensitive silicon-rich dielectric layer 370 are excited by the incident light to produce electro-hole pairs, and these electro-hole pairs can be separated by applying an external bias (or external electric field) to generate photoelectric current. The stoichiometry of silicon in the material of the photosensitive silicon-rich dielectric layer 370 is greater than that of other components, and the material of the photosensitive silicon-rich dielectric layer 370 may be silicon-rich $SiO_x$, silicon-rich $SiN_y$, silicon-rich $SiC_z$, silicon-rich $SiO_xN_y$, silicon-rich $SiO_xC_z$, $SiH_wO_x$, $SiH_wO_xN_y$, or a stacked layer of foregoing compounds, wherein $w<4$, $x<2$, $y<1.34$, and $z<1$. However, the invention is not limited thereto, and the material of the photosensitive silicon-rich dielectric layer 370 may also contain other suitable components. The electro-optical characteristics of the photosensitive silicon-rich dielectric layer 370 can be modulated and controlled to achieve optimal photoelectric conversion efficiency by adjusting the content of silicon in photosensitive silicon-rich dielectric layer 370 and the thickness of the photosensitive silicon-rich dielectric layer 370.

Additionally, in the present embodiment, by fabricating the guide layer 352 by using an oxide semiconductor to be an auxiliary layer, the electron-hole transmission effect of the photosensitive silicon-rich dielectric layer 370 is facilitated, so that the photoelectric conversion efficiency is further improved.

Moreover, in the present embodiment, the stacked photosensitive layer composed of the photosensitive silicon-rich dielectric layer 370 and the guide layer 352 can form a photo sensor 398 with the lower electrode 342 and the transparent upper electrode 382. The photo sensor 398 has a metal-insulation-metal (MIM) structure and can be integrated into the active device array substrate 300 of the display 400. In particular, the disposition manner adopted in the present embodiment can maximize the fill factor of the photo sensor and shield the backlight through the lower electrode 342 so as to protect the photo sensor from noises from the backlight source.

Below, some other display structures integrated with photo sensors and the manufacturing methods thereof provided by the invention will be described, wherein technical descriptions that are the same as or similar to those in foregoing embodiment will be omitted or simplified. On the other hand, the same or similar technical effect can be achieved by adopting the same or similar techniques in any related embodiment. Thus, the technical effects achieved by adopting the same or similar techniques will not be described in following embodiments. Related techniques can be adopted, combined, or skipped by those having ordinary knowledge in the art according to the actual requirement by referring to the embodiments described above and below.

FIGS. 5A-5F illustrate a display manufacturing method according to another embodiment of the invention. The difference between the present embodiment and the embodiment illustrated in FIGS. 3A-3F is that in the present embodiment, the guide layer and the photosensitive silicon-rich dielectric layer are disposed in a reversed sequence.

First, as shown in FIG. 5A, a first patterned metal layer 520 is formed on a substrate 510 to form a gate electrode 522. Then, as shown in FIG. 5B, a gate dielectric layer 530 is formed on the substrate 510 to cover the gate electrode 522. Besides, a second patterned metal layer 540 is formed on the gate dielectric layer 530 to form a lower electrode 542 and a source electrode 544 and a drain electrode 546.

Next, as shown in FIG. 5C, a photosensitive silicon-rich dielectric layer 570 is formed on the lower electrode 542. Besides, as shown in FIG. 5D, an oxide semiconductor layer 550 is formed on the second patterned metal layer 540 to form a channel layer 554 and a guide layer 552. The channel layer 554 is between the source electrode 544 and the drain electrode 546 and above the gate electrode 522. In addition, the guide layer 552 is on the photosensitive silicon-rich dielectric layer 570. The oxide semiconductor layer 550 may be made of IGZO. Moreover, the gate electrode 522, the gate dielectric layer 530, the source electrode 544 and the drain electrode 546, and the channel layer 554 form a thin film transistor 590, and the thin film transistor 590 is served as an active device.

Figure 5E:
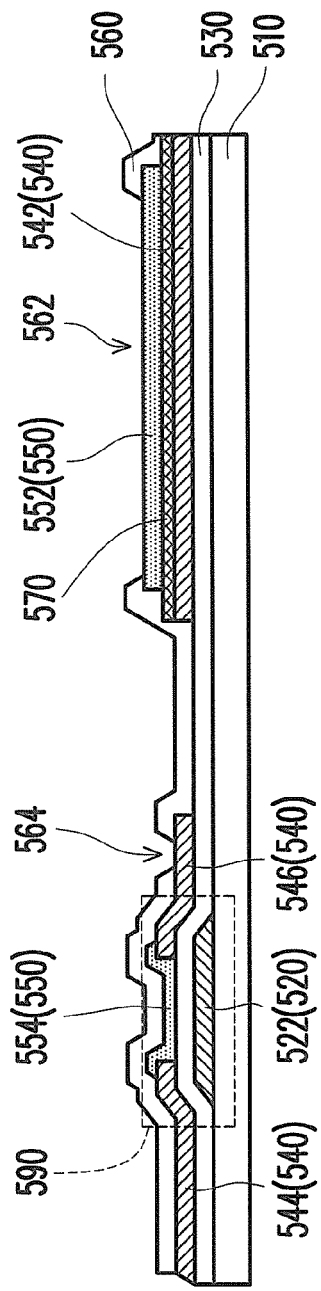

Thereafter, as shown in FIG. 5E, a passivation layer 560 is formed on the gate dielectric layer 530 to cover the second patterned metal layer 540 and the oxide semiconductor layer 550. The passivation layer 560 has a contact window 564 and an opening 562. The contact window 564 exposes at least a part of the drain electrode 546, and the opening 562 exposes at least a part of the guide layer 552.

Figure 5F:
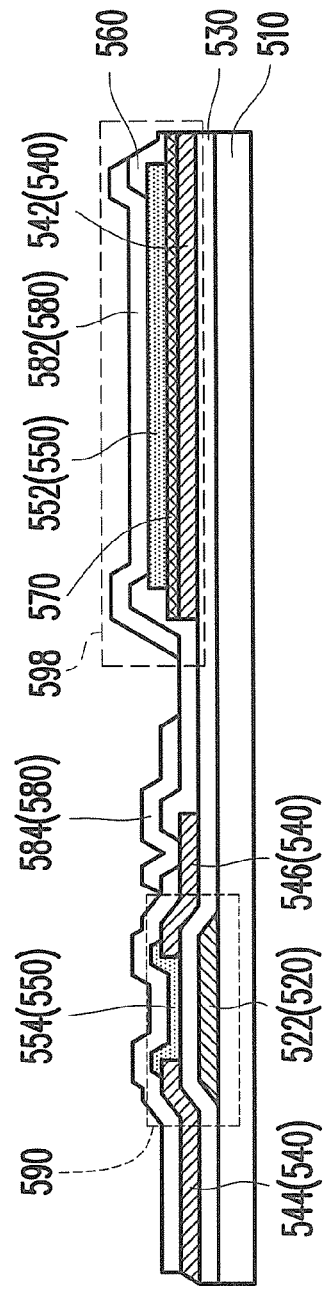

Next, as shown in FIG. 5F, a transparent conductive layer 580 is formed on the passivation layer 560 to form a pixel electrode 584 and a transparent upper electrode 582. The pixel electrode 584 is connected to the drain electrode 546 through the contact window 564, and the transparent upper electrode 582 is connected to the guide layer 552 through the opening 562. Accordingly, the stacked photosensitive layer composed of the photosensitive silicon-rich dielectric layer 570 and the guide layer 552 can form a photo sensor with the lower electrode 542 and the transparent upper electrode 582.

As described above, the difference between the present embodiment and the embodiment described above is that in the present embodiment, the photosensitive silicon-rich dielectric layer 570 is first formed, and the guide layer 552 is then formed on the photosensitive silicon-rich dielectric layer 570 to form the stacked photosensitive layer. Thus, the stacked photosensitive layer (guide layer 552/photosensitive silicon-rich dielectric layer 570) in the present embodiment has a reversed film sequence compared to the stacked photosensitive layer (photosensitive silicon-rich dielectric layer 370/guide layer 352) in the embodiment described above. When the guide layer 522 is disposed on the silicon-rich dielectric layer, ultraviolet light can be filtered by the guide layer 522 to further increase the sensitivity of visible light by the photosensitive silicon-rich dielectric layer 370.

Additionally, in the present embodiment, a display medium layer and an opposite electrode may also be disposed on the pixel electrode to accomplish a complete display, as shown in FIG. 4. However, these layers and devices will not be described again in the present embodiment, and the implementation thereof may be referred to the embodiment described above.

FIGS. 6A-6G illustrate a display manufacturing method according to another embodiment of the invention. The difference between the present embodiment and the embodiment illustrated in FIGS. 4A-4F is that in the present embodiment, the lower electrode is fabricated by using the first patterned metal layer (i.e., the lower electrode and the gate electrode in the present embodiment are the same layer).

Figure 6A:
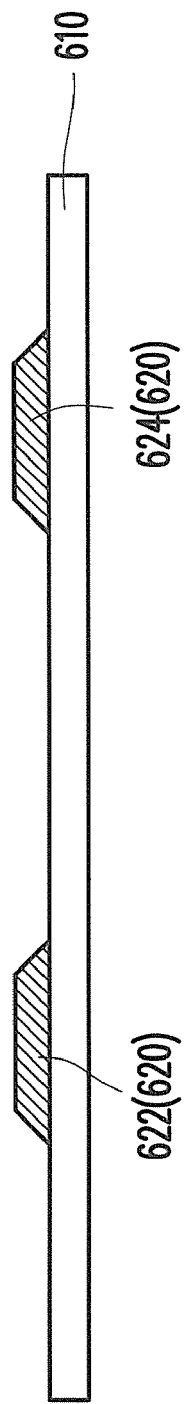
Figure 6B:
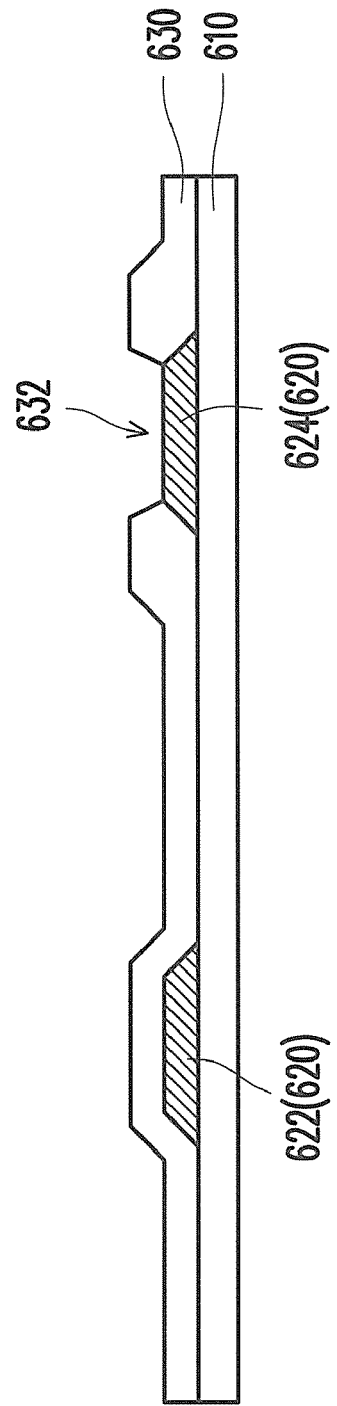

First, as shown in FIG. 6A, a first patterned metal layer 620 is formed on a substrate 610 to form a gate electrode 622 and a lower electrode 624. Then, as shown in FIG. 6B, a gate dielectric layer 630 is formed on the substrate 610 to cover the first patterned metal layer 620, wherein the gate dielectric layer 630 has a first opening 632, and the first opening 632 exposes at least a part of the lower electrode 624.

Next, as shown in FIG. 6C, a second patterned metal layer 640 is formed on the gate dielectric layer 630 to form a source electrode 644 and a drain electrode 646. Besides, as shown in FIG. 6D, a photosensitive silicon-rich dielectric layer 670 is formed within the first opening 632 and to cover the lower electrode 624. Thereafter, as shown in FIG. 6E, an oxide semiconductor layer 650 is formed on the second patterned metal layer 640 to form a channel layer 654 and a guide layer 652. The channel layer 654 is between the source electrode 644 and the drain electrode 646 and above the gate electrode 622. In addition, the guide layer 652 is on the photosensitive silicon-rich dielectric layer 670. The oxide semiconductor layer 650 may be made of IGZO. Moreover, the gate electrode 622, the gate dielectric layer 630, the source electrode 644 and the drain electrode 646, and the channel layer 654 form a thin film transistor 690, and the thin film transistor 690 is served as an active device.

After that, as shown in FIG. 6F, a passivation layer 660 is formed on the gate dielectric layer 630 to cover the second patterned metal layer 640 and the oxide semiconductor layer 650. The passivation layer 660 has a contact window 664 and a second opening 662. The contact window 664 exposes at least a part of the drain electrode 646, and the second opening 662 exposes at least a part of the guide layer 652.

Figure 6G:
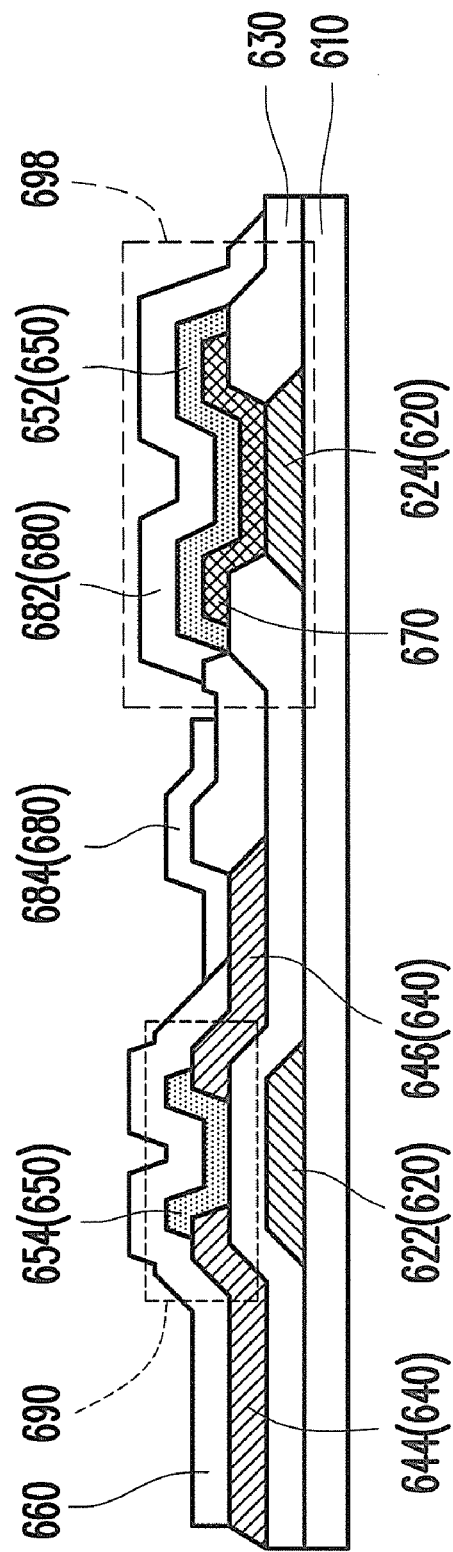

Next, as shown in FIG. 6G, a transparent conductive layer 680 is formed on the passivation layer 660 to form a pixel electrode 684 and a transparent upper electrode 682. The pixel electrode 684 is connected to the drain electrode 646 through the contact window 664, and the transparent upper electrode 682 is connected to the guide layer 652 through the second opening 662. Accordingly, the stacked photosensitive layer composed of the photosensitive silicon-rich dielectric layer 670 and the guide layer 652 can form a photo sensor with the lower electrode 624 and the transparent upper electrode 682.

As described above, the difference between the present embodiment and the embodiment described above is that in the present embodiment, the lower electrode is fabricated by using the first patterned metal layer, while in the embodiment described above, the lower electrode is fabricated by using the second patterned metal layer. In other words, in the present embodiment, the lower electrode and the gate electrode are formed from the same layer, while in the embodiment described above, the lower electrode and the source electrode and the drain electrode are formed from the same layer.

Additionally, in the present embodiment, a display medium layer and an opposite electrode may also be disposed on the pixel electrode to accomplish a complete display, as shown in FIG. 4. However, these layers and devices will not be described again in the present embodiment, and the implementation thereof may be referred to the embodiment described above.

FIGS. 7A-7G illustrate a display manufacturing method according to another embodiment of the invention. The difference between the present embodiment and the embodiment illustrated in FIGS. 6A-6G falls on the structure of the active device.

Figure 7A:
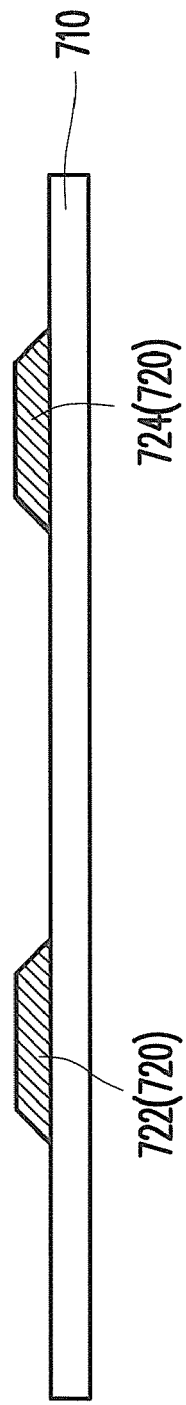
Figure 7B:
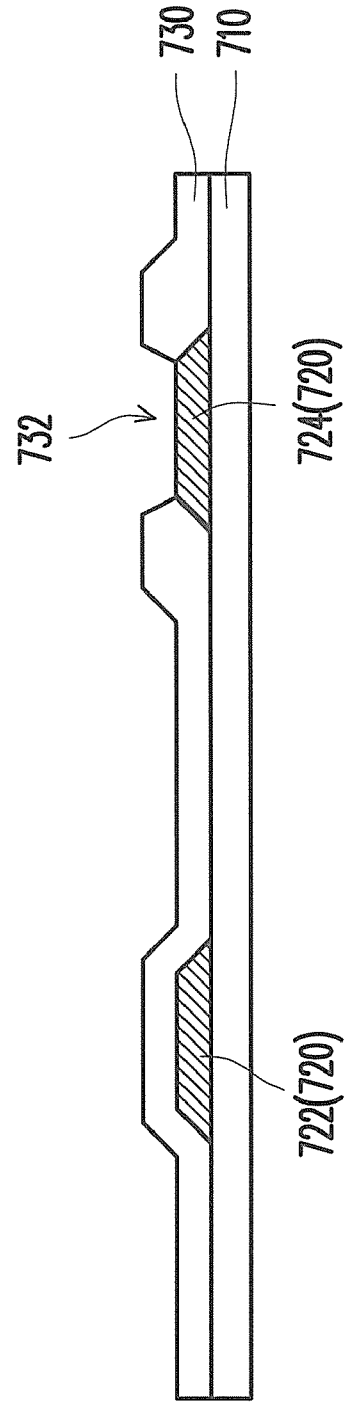

First, as shown in FIG. 7A, a first patterned metal layer 720 is formed on a substrate 710 to form a gate electrode 722 and a lower electrode 724. Then, as shown in FIG. 7B, a gate dielectric layer 730 is formed on the substrate 710 to cover the first patterned metal layer 720, wherein the gate dielectric layer 730 has a first opening 732, and the first opening 732 exposes at least a part of the lower electrode 724.

Next, as shown in FIG. 7C, a photosensitive silicon-rich dielectric layer 770 is formed within the first opening 732 and to cover the lower electrode 724. Besides, as shown in FIG.

7D, an oxide semiconductor layer 750 is formed on the gate dielectric layer 730 to form a channel layer 754 and a guide layer 752. The channel layer 754 is above the gate electrode 722, and the guide layer 752 is disposed on the photosensitive silicon-rich dielectric layer 770. The oxide semiconductor layer 750 may be made of IGZO.

Thereafter, as shown in FIG. 7E, a second patterned metal layer 740 is formed on the gate dielectric layer 730 to form a source electrode 744 and a drain electrode 746. The source electrode 744 and the drain electrode 746 cover both sides of the channel layer 754. The gate electrode 722, the gate dielectric layer 730, the source electrode 744 and the drain electrode 746, and the channel layer 754 form a thin film transistor 790, and the thin film transistor 790 is served as an active device.

Next, as shown in FIG. 7F, a passivation layer 760 is formed on the gate dielectric layer 730 to cover the second patterned metal layer 740 and the oxide semiconductor layer 750. The passivation layer 760 has a contact window 764 and a second opening 762. The contact window 764 exposes at least a part of the drain electrode 746, and the second opening 762 exposes at least a part of the guide layer 752.

Figure 7G:
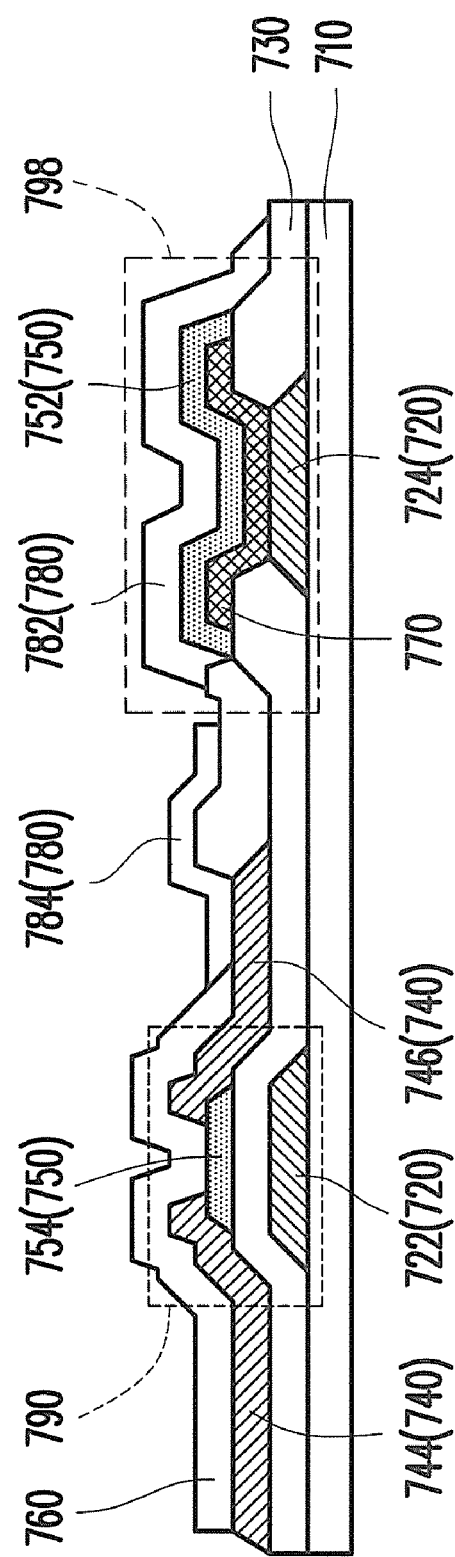

After that, as shown in FIG. 7G, a transparent conductive layer 780 is formed on the passivation layer 760 to form a pixel electrode 784 and a transparent upper electrode 782. The pixel electrode 784 is connected to the drain electrode 746 through the contact window 764, and the transparent upper electrode 782 is connected to the guide layer 752 through the second opening 762. Accordingly, the stacked photosensitive layer composed of the photosensitive silicon-rich dielectric layer 770 and the guide layer 752 can form a photo sensor with the lower electrode 724 and the transparent upper electrode 782.

As described above, the difference between the present embodiment and the embodiment described above is that in the present embodiment, the channel layer is below part of the source electrode and the drain electrode, while in the embodiment described above, the channel layer is above part of the source electrode and the drain electrode.

Additionally, in the present embodiment, a display medium layer and an opposite electrode may also be disposed on the pixel electrode to accomplish a complete display, as shown in FIG. 4. However, these layers and devices will not be described again in the present embodiment, and the implementation thereof may be referred to the embodiment described above.

FIGS. 8A-8G illustrate a display manufacturing method according to another embodiment of the invention. The difference between the present embodiment and the embodiment illustrated in FIGS. 6A-6G is that in the present embodiment, the photo sensor has no guide layer.

Figure 8A:
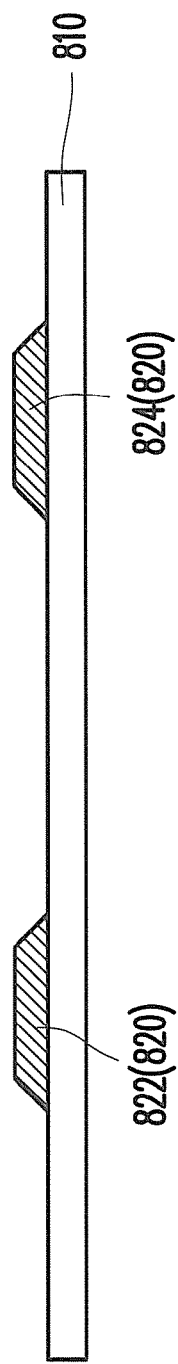
Figure 8B:
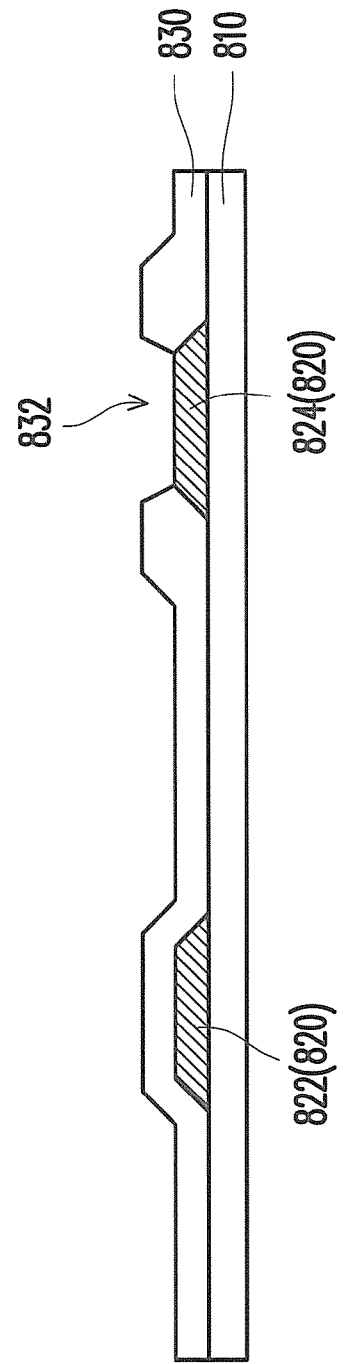

First, as shown in FIG. 8A, a first patterned metal layer 820 is formed on a substrate 810 to form a lower electrode 824 and a gate electrode 822. Then, as shown in FIG. 8B, a gate dielectric layer 830 is formed on the substrate 810 to cover the first patterned metal layer 820, wherein the gate dielectric layer 830 has a first opening 832, and the first opening 832 exposes at least a part of the lower electrode 824.

Figure 8C:
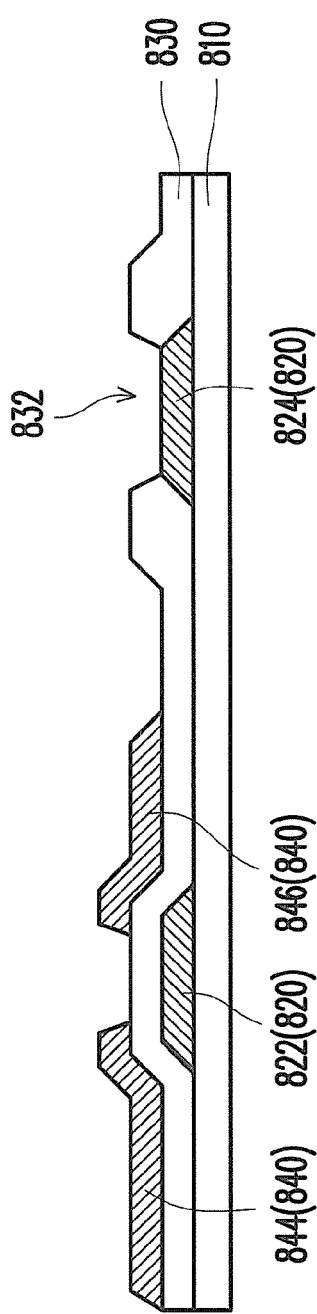
Figure 8D:
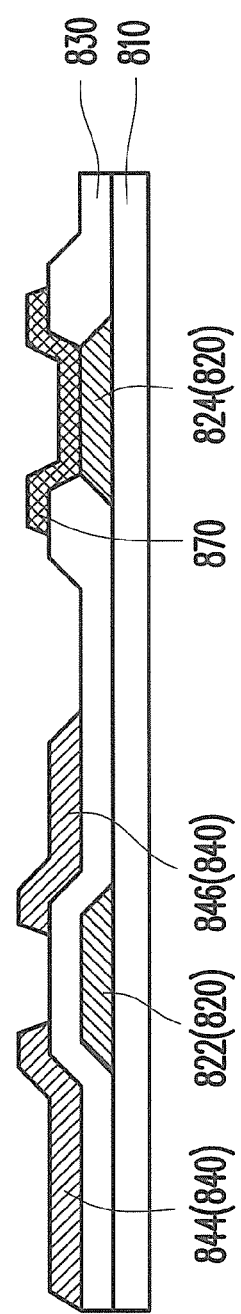

Next, as shown in FIG. 8C, a second patterned metal layer 840 is formed on the gate dielectric layer 830 to form a source electrode 844 and a drain electrode 846. Besides, as shown in FIG. 8D, a photosensitive silicon-rich dielectric layer 870 is formed within the first opening 832 and to cover the lower electrode 824.

Thereafter, as shown in FIG. 8E, an oxide semiconductor layer 850 is formed on the second patterned metal layer 840 to form a channel layer 854. The channel layer 854 is between the source electrode 844 and the drain electrode 846 and above the gate electrode 822. The oxide semiconductor layer 850 may be made of IGZO. In addition, the gate electrode 822, the gate dielectric layer 830, the source electrode 844 and the drain electrode 846, and the channel layer 854 form a thin film transistor 890, and the thin film transistor 890 is served as an active device.

After that, as shown in FIG. 8F, a passivation layer 860 is formed on the gate dielectric layer 830 to cover the second patterned metal layer 840, the oxide semiconductor layer 850, and the photosensitive silicon-rich dielectric layer 870. The passivation layer 860 has a contact window 864 and a second opening 862. The contact window 864 exposes at least a part of the drain electrode 846, and the second opening 862 exposes at least a part of the photosensitive silicon-rich dielectric layer 870.

Figure 8G:
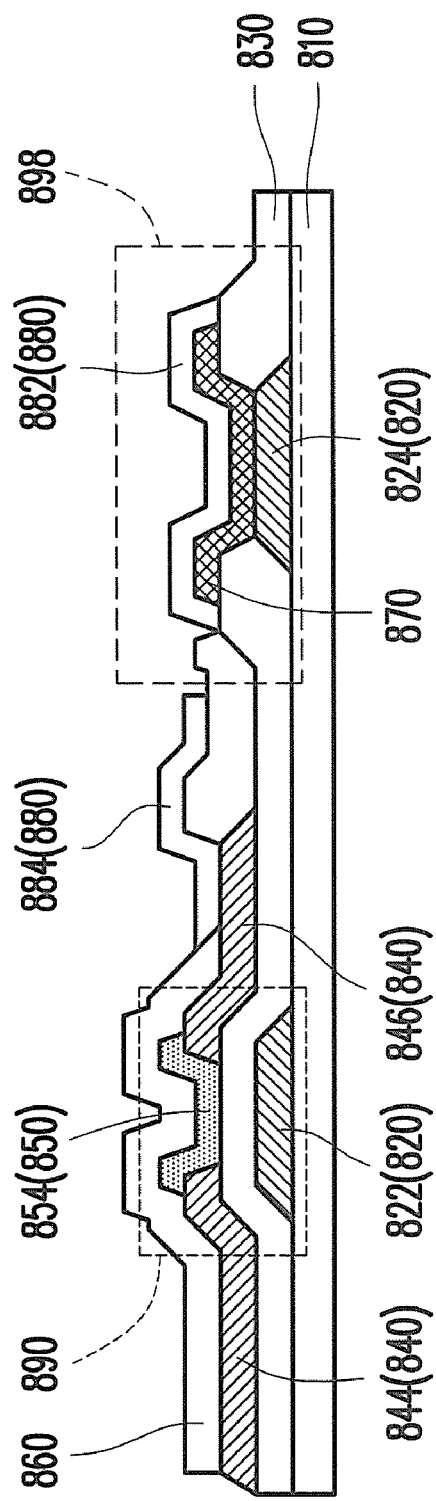

Next, as shown in FIG. 8G, a transparent conductive layer 880 is foamed on the passivation layer 860 to form a pixel electrode 884 and a transparent upper electrode 882. The pixel electrode 884 is connected to the drain electrode 846 through the contact window 864, and the transparent upper electrode 882 is connected to the photosensitive silicon-rich dielectric layer 870 through the second opening 862. Accordingly, the photosensitive silicon-rich dielectric layer 870 can form a photo sensor with the lower electrode 824 and the transparent upper electrode 882.

As described above, the difference between the present embodiment and the embodiment illustrated in FIGS. 6A-6G is that in the present embodiment, the photo sensor is composed of a photosensitive silicon-rich dielectric layer, a lower electrode, and a transparent upper electrode. Additionally, in the present embodiment, a display medium layer and an opposite electrode may also be disposed on the pixel electrode to accomplish a complete display, as shown in FIG. 4. However, these layers and devices will not be described again in the present embodiment, and the implementation thereof may be referred to the embodiment described above.

FIGS. 9A-9F illustrate a display manufacturing method according to another embodiment of the invention. The difference between the present embodiment and the embodiment illustrated in FIGS. 5A-5F is that the photo sensor in the present embodiment has no guide layer.

Figure 9A:
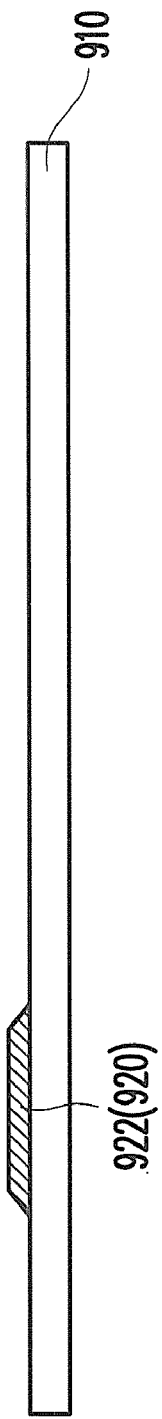
Figure 9B:
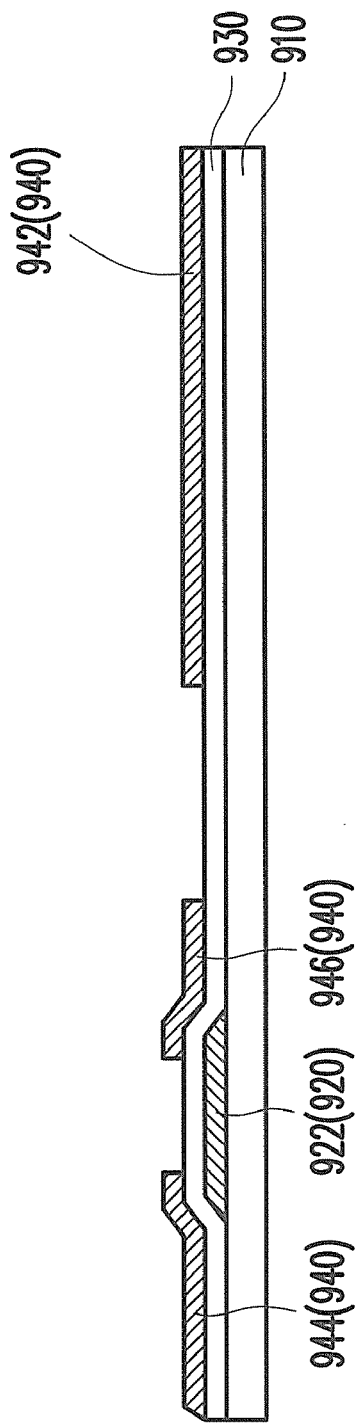

First, as shown in FIG. 9A, a first patterned metal layer 920 is formed on a substrate 910 to form a gate electrode 922. Then, as shown in FIG. 9B, a gate dielectric layer 930 is formed on the substrate 910 to cover the gate electrode 922. Besides, a second patterned metal layer 940 is formed on the gate dielectric layer 930 to form a lower electrode 942 and a source electrode 944 and a drain electrode 946.

Next, as shown in FIG. 9C, a photosensitive silicon-rich dielectric layer 970 is formed on the lower electrode 942. Besides, as shown in FIG. 9D, an oxide semiconductor layer 950 is formed on the second patterned metal layer 940 to form a channel layer 954. The channel layer 954 is between the source electrode 944 and the drain electrode 946 and above the gate electrode 922. The oxide semiconductor layer 950 may be made of IGZO. In addition, the gate electrode 922, the gate dielectric layer 930, the source electrode 944 and the drain electrode 946, and the channel layer 954 form a thin film transistor 990, and the thin film transistor 990 is served as an active device.

Thereafter, as shown in FIG. 9E, a passivation layer 960 is formed on the gate dielectric layer 930 to cover the second patterned metal layer 940, the oxide semiconductor layer 950, and the photosensitive silicon-rich dielectric layer 970. The passivation layer 960 has a contact window 964 and an opening 962. The contact window 964 exposes at least a part of the drain electrode 946, and the opening 962 exposes at least a part of the photosensitive silicon-rich dielectric layer 970. The steps illustrated in FIG. 9D and FIG. 9E can be executed in a reversed sequence. Namely, in the present embodiment, the passivation layer 960 may be formed before forming the photosensitive silicon-rich dielectric layer 970 within the opening 962 of the passivation layer 960.

After that, as shown in FIG. 9F, a transparent conductive layer 980 is formed on the passivation layer 960 to form a pixel electrode 984 and a transparent upper electrode 982. The pixel electrode 984 is connected to the drain electrode 946 through the contact window 964, and the transparent upper electrode 982 is connected to the photosensitive silicon-rich dielectric layer 970 through the opening 962. Accordingly, the photosensitive silicon-rich dielectric layer 970 can form a photo sensor with the lower electrode 942 and the transparent upper electrode 982.

A few possible display structures in the invention have been described above, wherein a photo sensor is formed by using a stacked photosensitive layer composed of a photosensitive silicon-rich dielectric layer and a guide layer, a transparent upper electrode, and a lower electrode so as to achieve an optimal photoelectric conversion efficiency. Herein because the guide layer is fabricated by using an oxide semiconductor, the electron-hole transmission effect of the photosensitive silicon-rich dielectric layer is improved.

According to the invention, the guide layer may be omitted and the photo sensor may be formed by using a photosensitive silicon-rich dielectric layer, a transparent upper electrode, and a lower electrode. In addition, the structure of the active device may be changed according to the actual requirement.

In an alternative embodiment, the invention is not limited to the adoption of a photosensitive silicon-rich dielectric layer. Instead, any other photosensitive material layer with similar photo-sensing characteristics (for example, a photosensitive semiconductor layer) may also be adopted for replacing the photosensitive silicon-rich dielectric layer in each of foregoing embodiments to achieve similar technical effects.

Any photo sensor structure provided by the invention can be integrated into and fabricated along with the active device array substrate of a display without increasing the manufacturing cost. In particular, the disposition manner adopted in the invention can maximize the fill factor of the photo sensor and shield the backlight through the lower electrode, so as to protect the photo sensor from noises produced by the backlight source.

In a display provided by the invention, the photo sensor can be used for achieving an in-cell touch-input function or served as an ambient light sensor. Herein the photo sensor offers optimal electro-optical characteristics, the capability of modulating absorption spectrum, and a high process integration capability. When the guide layer and the channel layer are made by the same layer, the manufacture cost can be further diminished.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A display, comprising:
   a substrate;
   an active device, disposed on the substrate, the active device having a channel layer;
   a pixel electrode, disposed on the substrate and electrically connected to the active device;
   a photo sensor, disposed on the substrate, the photo sensor comprising:
     a lower electrode, disposed on the substrate;
     a stacked photosensitive layer, disposed on the lower electrode, the stacked photosensitive layer comprising a photosensitive silicon-rich dielectric layer and a guide layer that are stacked together, wherein the channel layer and the guide layer are a same layer and are formed by an oxide semiconductor; and
     a transparent upper electrode, disposed on the stacked photosensitive layer.

2. The display according to claim 1, wherein the oxide semiconductor comprises indium gallium zinc oxide (IGZO).

3. The display according to claim 1, wherein the guide layer is located between the photosensitive silicon-rich dielectric layer and the lower electrode.

4. The display according to claim 1, wherein the guide layer is located between the photosensitive silicon-rich dielectric layer and the transparent upper electrode.

5. The display according to claim 1, wherein the pixel electrode and the transparent upper electrode are formed by a same layer.

6. The display according to claim 1, wherein the active device comprises:
   a gate electrode, disposed on the substrate;
   a gate dielectric layer, disposed on the substrate and covering the gate electrode;
   a source electrode and a drain electrode, disposed on the gate dielectric layer and at both sides of the gate electrode; and
   the channel layer, disposed on the gate dielectric layer and above the gate electrode, and located between the source electrode and the drain electrode.

7. The display according to claim 6, wherein the lower electrode and the gate electrode are formed by a same layer.

8. The display according to claim 6, wherein the lower electrode and the source electrode and the drain electrode are formed by a same layer.

9. The display according to claim 6 further comprising a passivation layer, wherein the passivation layer covers the gate dielectric layer, the source electrode and the drain electrode, and the oxide semiconductor, the passivation layer has a contact window, the pixel electrode is electrically connected to the drain electrode through the contact window, the passivation layer has an opening, and the transparent upper electrode is electrically connected to the stacked photosensitive layer through the opening.

10. The display according to claim 6, wherein the channel layer is between the source electrode and the drain electrode and on a part of the source electrode and the drain electrode.

11. The display according to claim 7, wherein the channel layer is between the source electrode and the drain electrode and below a part of the source electrode and the drain electrode.

12. The display according to claim 1 having a display area and a peripheral circuit area surrounding the display area, wherein the active device is within the display area, and the photo sensor is within the peripheral circuit area.

13. The display according to claim 1 having a plurality of pixel areas, wherein the pixel areas are arranged into an array, and the active device and the photo sensor are within a same one of the pixel areas.

14. The display according to claim 1 further comprising a display medium layer and an opposite electrode, wherein the display medium layer is disposed on the pixel electrode, and the opposite electrode is disposed on the display medium layer.

15. The display according to claim 14, wherein the display medium layer comprises a liquid crystal layer, an organic light emitting layer, or an electrophoresis material layer.

16. A display, comprising:
a substrate;
an active device, disposed on the substrate, the active device having a channel layer;
a pixel electrode, disposed on the substrate and electrically connected to the active device;
a photo sensor, disposed on the substrate, the photo sensor comprising:
a lower electrode, disposed on the substrate;
a stacked photosensitive layer, disposed on the lower electrode, the stacked photosensitive layer comprising a photosensitive material layer and a guide layer that are stacked together, wherein the channel layer and the guide layer are a same layer and are formed by an oxide semiconductor; and
a transparent upper electrode, disposed on the stacked photosensitive layer.

17. The display according to claim 16, wherein the photosensitive material layer comprises a photosensitive silicon-rich dielectric layer or a photosensitive semiconductor layer.

18. A manufacturing method of a display, comprising:
providing a substrate;
fabricating an active device on the substrate, wherein the active device has a channel layer;
forming a lower electrode on the substrate;
forming a stacked photosensitive layer on the lower electrode, wherein the stacked photosensitive layer comprises a photosensitive silicon-rich dielectric layer and a guide layer that are stacked together, and the channel layer and the guide layer are a same layer and are formed by an oxide semiconductor;
forming a transparent upper electrode on the stacked photosensitive layer; and
forming a pixel electrode on the substrate, wherein the pixel electrode is electrically connected to the active device.

19. The manufacturing method according to claim 18 comprising:
forming a first patterned metal layer on the substrate to form a gate electrode of the active device;
forming a gate dielectric layer on the substrate to cover the first patterned metal layer; p1 forming a second patterned metal layer on the gate dielectric layer to form the lower electrode and a source electrode and a drain electrode of the active device;
forming an oxide semiconductor layer on the second patterned metal layer to form the channel layer of the active device and the guide layer, wherein the channel layer is between the source electrode and the drain electrode and above the gate electrode;
forming a passivation layer on the gate dielectric layer to cover the second patterned metal layer and the oxide semiconductor layer, wherein the passivation layer has a contact window and an opening, the contact window exposes at least a part of the drain electrode, and the opening exposes at least a part of the guide layer;
forming the photosensitive silicon-rich dielectric layer within the opening and to cover the guide layer; and
forming a transparent conductive layer on the passivation layer to foam the pixel electrode and the transparent upper electrode, wherein the pixel electrode is connected to the drain electrode of the active device through the contact window, and the transparent upper electrode is connected to the photosensitive silicon-rich dielectric layer through the opening.

20. The manufacturing method according to claim 18 comprising:
forming a first patterned metal layer on the substrate to form a gate electrode of the active device;
forming a gate dielectric layer on the substrate to cover the first patterned metal layer;
forming a second patterned metal layer on the gate dielectric layer to form the lower electrode and a source electrode and a drain electrode of the active device;
forming the photosensitive silicon-rich dielectric layer on the lower electrode;
forming an oxide semiconductor layer on the second patterned metal layer to form the channel layer of the active device and the guide layer, wherein the channel layer is between the source electrode and the drain electrode and above the gate electrode, and the guide layer is on the photosensitive silicon-rich dielectric layer;
forming a passivation layer on the gate dielectric layer to cover the second patterned metal layer and the oxide semiconductor layer, wherein the passivation layer has a contact window and an opening, the contact window exposes at least a part of the drain electrode, and the opening exposes at least a part of the guide layer; and
forming a transparent conductive layer on the passivation layer to form the pixel electrode and the transparent upper electrode, wherein the pixel electrode is connected to the drain electrode of the active device through the contact window, and the transparent upper electrode is connected to the guide layer through the opening.

21. The manufacturing method according to claim 18 comprising:
forming a first patterned metal layer on the substrate to form the lower electrode and a gate electrode of the active device;
forming a gate dielectric layer on the substrate to cover the first patterned metal layer, wherein the gate dielectric layer has a first opening, and the first opening exposes at least a part of the lower electrode;
forming the photosensitive silicon-rich dielectric layer within the first opening and to cover the lower electrode;
forming a second patterned metal layer on the gate dielectric layer to form a source electrode and a drain electrode of the active device;
forming an oxide semiconductor layer on the second patterned metal layer to form the channel layer of the active device and the guide layer, wherein the channel layer is between the source electrode and the drain electrode and above the gate electrode, and the guide layer is disposed on the photosensitive silicon-rich dielectric layer;
forming a passivation layer on the gate dielectric layer to cover the second patterned metal layer and the oxide semiconductor layer, wherein the passivation layer has a contact window and a second opening, the contact window exposes at least a part of the drain electrode, and the second opening exposes at least a part of the guide layer; and
forming a transparent conductive layer on the passivation layer to form the pixel electrode and the transparent upper electrode, wherein the pixel electrode is connected to the drain electrode of the active device through the contact window, and the transparent upper electrode is connected to the guide layer through the second opening.

22. The manufacturing method according to claim 18 comprising:
- forming a first patterned metal layer on the substrate to form a gate electrode of the active device and the lower electrode;
- forming a gate dielectric layer on the substrate to cover the first patterned metal layer, wherein the gate dielectric layer has a first opening, and the first opening exposes at least a part of the lower electrode;
- forming the photosensitive silicon-rich dielectric layer within the first opening and to cover the lower electrode;
- forming a oxide semiconductor layer on the gate dielectric layer to form the channel layer of the active device and the guide layer, wherein the channel layer is above the gate electrode, and the guide layer is disposed on the photosensitive silicon-rich dielectric layer;
- forming a second patterned metal layer on the gate dielectric layer to form a source electrode and a drain electrode of the active device, wherein the source electrode and the drain electrode cover two opposite sides of the channel layer;
- forming a passivation layer on the gate dielectric layer to cover the second patterned metal layer and the oxide semiconductor layer, wherein the passivation layer has a contact window and a second opening, the contact window exposes at least a part of the drain electrode, and the second opening exposes at least a part of the guide layer;
- forming a transparent conductive layer on the passivation layer to form the pixel electrode and the transparent upper electrode, wherein the pixel electrode is connected to the drain electrode of the active device through the contact window, and the transparent upper electrode is connected to the guide layer through the second opening.

23. A manufacturing method of a display, comprising:
providing a substrate;
fabricating an active device on the substrate, wherein the active device has a channel layer, and the channel layer is formed by an oxide semiconductor;
forming a lower electrode on the substrate;
forming a photosensitive silicon-rich dielectric layer on the lower electrode;
forming a transparent upper electrode on the stacked photosensitive layer; and
forming a pixel electrode on the substrate, wherein the pixel electrode is electrically connected to the active device.

24. The manufacturing method according to claim 23 comprising:
- forming a first patterned metal layer on the substrate to form the lower electrode and a gate electrode of the active device;
- forming a gate dielectric layer on the substrate to cover the first patterned metal layer, wherein the gate dielectric layer has a first opening, and the first opening exposes at least a part of the lower electrode;
- forming the photosensitive silicon-rich dielectric layer within the first opening and to cover the lower electrode;
- forming a second patterned metal layer on the gate dielectric layer to form a source electrode and a drain electrode of the active device;
- forming an oxide semiconductor layer on the second patterned metal layer to form a channel layer of the active device, wherein the channel layer is between the source electrode and the drain electrode and above the gate electrode;
- forming a passivation layer on the gate dielectric layer to cover the second patterned metal layer, the oxide semiconductor layer, and the photosensitive silicon-rich dielectric layer, wherein the passivation layer has a contact window and a second opening, the contact window exposes at least a part of the drain electrode, and the second opening exposes at least a part of the photosensitive silicon-rich dielectric layer; and
- forming a transparent conductive layer on the passivation layer to form the pixel electrode and the transparent upper electrode, wherein the pixel electrode is connected to the drain electrode of the active device through the contact window, and the transparent upper electrode is connected to the photosensitive silicon-rich dielectric layer through the second opening.

25. The manufacturing method according to claim 23 comprising:
- forming a first patterned metal layer on the substrate to form a gate electrode of the active device;
- forming a gate dielectric layer on the substrate to cover the first patterned metal layer;
- forming a second patterned metal layer on the gate dielectric layer to form the lower electrode and a source electrode and a drain electrode of the active device;
- forming an oxide semiconductor layer on the second patterned metal layer to form a channel layer of the active device, wherein the channel layer is between the source electrode and the drain electrode and above the gate electrode;
- forming a passivation layer on the gate dielectric layer to cover the second patterned metal layer and the oxide semiconductor layer, wherein the passivation layer has a contact window and an opening, the contact window exposes at least a part of the drain electrode, and the opening exposes at least a part of the lower electrode;
- forming the photosensitive silicon-rich dielectric layer within the opening and to cover the lower electrode; and
- forming a transparent conductive layer on the passivation layer to form the pixel electrode and the transparent upper electrode, wherein the pixel electrode is connected to the drain electrode of the active device through the contact window, and the transparent upper electrode is connected to the photosensitive silicon-rich dielectric layer through the opening.

* * * * *